United States Patent [19]

May

[11] Patent Number: 4,704,678
[45] Date of Patent: Nov. 3, 1987

[54] FUNCTION SET FOR A MICROCOMPUTER

[75] Inventor: Michael D. May, Bristol, England

[73] Assignee: Inmos Limited, Briston, England

[21] Appl. No.: 553,028

[22] Filed: Nov. 16, 1983

[30] Foreign Application Priority Data

Nov. 26, 1982 [GB] United Kingdom ............... 8233733

[51] Int. Cl.$^4$ ................... G06F 9/00; G06F 13/00
[52] U.S. Cl. .................................... 364/200; 364/300
[58] Field of Search ... 364/200 MS File, 900 MS File, 364/300

[56] References Cited

U.S. PATENT DOCUMENTS

| | | | |
|---|---|---|---|
| 3,657,705 | 4/1972 | Mekota, Jr. et al. | 364/200 |
| 3,766,532 | 10/1973 | Liebel, Jr. | 364/200 |
| 4,025,904 | 5/1977 | Adney et al. | 364/200 |
| 4,034,345 | 7/1977 | Deis | 364/200 |
| 4,047,247 | 9/1977 | Stanley et al. | 364/200 |
| 4,084,228 | 4/1978 | Dufond et al. | 364/200 |
| 4,103,329 | 7/1978 | Davis et al. | 364/200 |
| 4,109,310 | 8/1978 | England et al. | 364/200 |
| 4,258,419 | 3/1981 | Blahut et al. | 364/200 |
| 4,434,462 | 2/1984 | Guttag et al. | 364/200 |
| 4,482,950 | 11/1984 | Dshkunian et al. | 364/200 |
| 4,494,187 | 1/1985 | Simpson | 364/200 |
| 4,495,563 | 1/1985 | McDonough | 364/200 |
| 4,532,587 | 7/1985 | Roskell et al. | 364/200 |

OTHER PUBLICATIONS

"BCPL, The Language and its Compiler", by M. Richards and C. Whitey-Strevens, Cambridge University Press, 1980.

Treleaven, "VLSI Processor Architectures," *Computer*, pp. 33-45, (Jun. 1982).

Browning & Seitz, "Communication in a Tree Machine," Caltech Conference on VLSI, (1981), pp. 510-526.

Schnabel, "Microprogrammed Byte Moves with Word Offset," *IBM Technical Disclosure Bulletin*, vol. 8, No. 4, (Sep. 1965), pp. 549-552.

Dirac, "Control Word Expansion," *IBM Technical Disclosure Bulletin*, vol. 3, No. 7, (Dec. 1960), p. 23.

Taylor, "A Method of Increasing the Number of Orders in a Digital Computer," *IRE Transaction on Electronic Computers*, vol. EC-11, No. 3, (Jun. 1962), p. 416.

Smith, "Multi-Function Single Chip Microcomputers," *Electro/80 Conference Record*, May 13-15, 1980, vol. 5, pp. 1-110.

(List continued on next page.)

*Primary Examiner*—Archie E. Williams, Jr.
*Assistant Examiner*—William G. Niessen
*Attorney, Agent, or Firm*—Edward D. Manzo

[57] ABSTRACT

A programmable, high speed, single chip microcomputer includes 4K of RAM, ROM, registers and an ALU. Program can be stored in the on-chip RAM. The first local variable of each process to be executed is a workspace pointer (WPTR), and each process has a respective workspace identified by its WPTR. For each process, addressing of other variables is relative to the current WPTR, which is stored in a workspace pointer register (WPTR REG). Instructions are constant bit size, having a function portion and a data portion loaded, respectively, into an instruction buffer (IB) and an operand register (OREGTR). Memory address locations are formed by combining the contents of the workspace pointer register and the operand register, or the contents of the A Register and the operand register. A set of "direct functions" obtains data from OREG. "Indirect functions" use the OREG contents to identify other functions, obtaining data from registers other than the operand register. A "prefixing" function (PFIX) develops operands having long bit lengths. Scheduling and descheduling of processes are achieved by forming a linked list within the several workspaces for the active processes. Each workspace identifies the workspace pointer of the next process to be executed. Each workspace contains in memory the identification of the next instruction to be executed for that respective process. A "last pointer" register (LPTR REG.) cooperates in the scheduling operations. Each microcomputer chip can be coupled serially to other such chips on a respective pair of only two wires, each a unidirectional channel. Each channel also has two registers, one for process identification and one for data, Communications are synchronized.

32 Claims, 24 Drawing Figures

OTHER PUBLICATIONS

"Chapter 8—The Zilog Z8," *Osborne 4 and 8-Bit Microprocessor Handbook*, (1981), pp. 8-1 to 8-56.

"Chapter 6—The 8048 Microcomputer Devices," *Osborne 4 and 8-Bit Microprocessor Handbook*, pp. 6-1 to 6-40, (1981).

"Chapter 16: Overview of the Intel iAPX 432 Microprocessor" and Chapter 17: iAPX 432GDP Architecture, *Advances in Computer Architecture* (2nd Edition), pp. 335-389, (1982).

"Chapter 5—The DEC PDP-8," *Computer Structures: Readings and Examples*, pp. 120-140, (1971).

"Chapter 28: Microprogramming and the Design of the Control Circuits in an Electronic Digital Computer," *Computer Structures: Readings and Examples*, pp. 335-340, (1971).

"Chapter 13—IBM6100 Microcomputer Devices," *Osborne 4 and 8-Bit Microprocessor Handbook*, pp. 13-1 to 13-46, (1981).

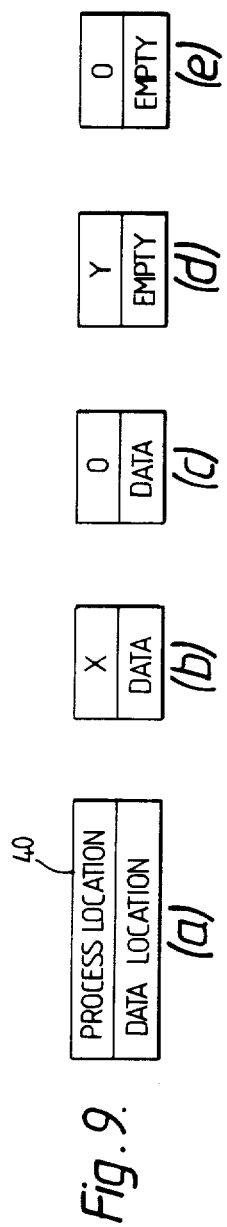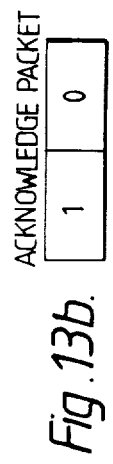
Fig. 9.
Fig. 13a.
Fig. 13b.

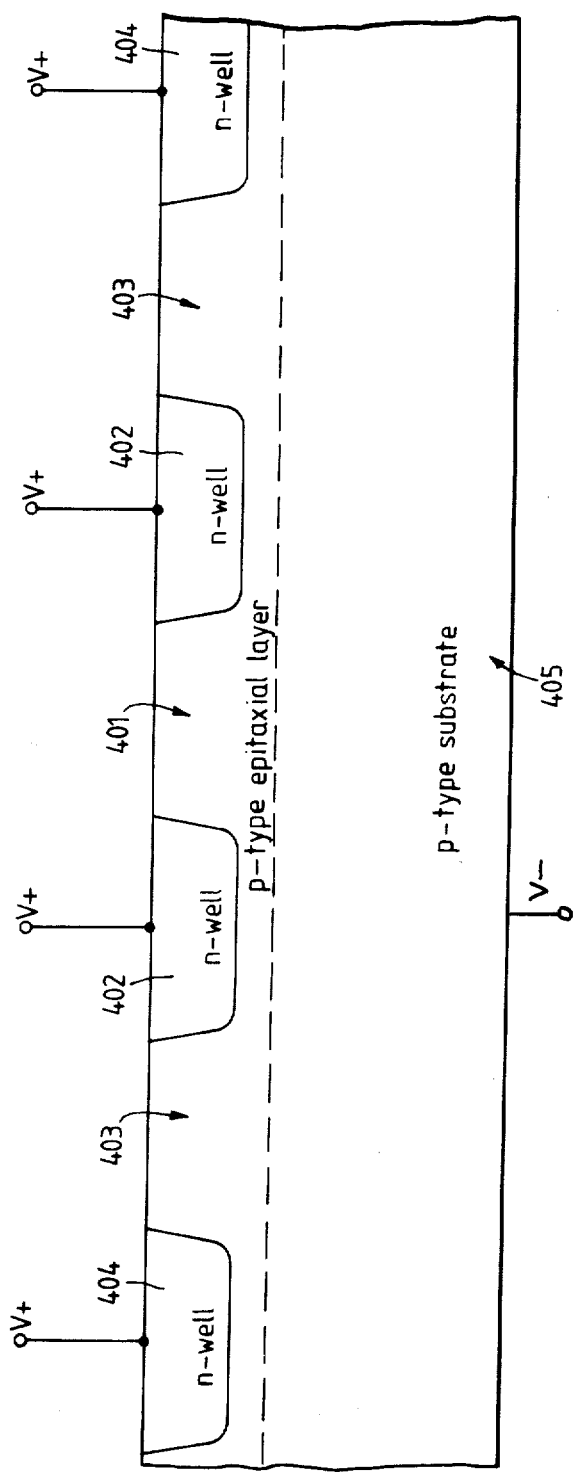

FUNCTION SET FOR A MICROCOMPUTER

This application is one of five applications assigned to Inmos Limited, each filed on Nov. 16, 1983 having U.S. Ser. No. 552,601; 552,602; 553,027; 553,028; and 553,029. These five applications have identical descriptions from pages 6 through 85.

BACKGROUND TO THE INVENTION

Microcomputers generally operate in accordance with a sequence of instructions derived from a stored program. One important part of each instruction is the so-called "function" which is to be carried out by the processor in response to that instruction. It is also important to identify the data, or the name of the register holding the data, or the address in memory where the data can be found, on which that function is to be carried out. As the processor must know how to respond to any particular "function" which arises in an instruction from the program, it is necessary to operate with a limited set of possible "functions". This is known as a "function set" and represents the full range of functions which the processor is capable of identifying and obeying. Each time an instruction is received by the processor it has to translate the function of that instruction into one or more micro-instructions which control the transfer of electrical signals within the microcomputer so that signal exchanges occur between registers, memory and data paths in order to carry out the required instructions.

The development of integrated circuit technology has led to more components being provided on a microcomputer chip with a demand for an increased range of functions by the processor. This has caused function sets used in microcomputers to become more complex. The function sets have attempted to cover a greater quantity of functions thereby requiring larger numbers of bits in order to define the functions and this in turn has required increased decoding in order for the processor to respond to the coded function. Larger function sets have required a larger processor as well as greater time delays in decoding the functions and carrying out the micro-instructions resulting from those functions.

OBJECTS OF THE INVENTION

It is an object of the present invention to provide a computer with an improved function set.

It is a further object of the invention to provide a computer with a minimum number of functions while not limiting the operating capability of the processor for the microcomputer.

It is a further object of the invention to provide a computer in which the function set enables rapid operation of a compact processor with the minimum of decoding delay for the commonly required functions of the processor by defining these as direct functions.

It is a further object of the invention to provide a computer in which the function set requires a a small number of dedicated registers thereby enabling the processor to be particularly small in size.

It is a further object of the invention to provide a computer having a function set which incorporates indirect functions to enable the microcomputer to carry out a wide variety of functions.

It is a further object of the invention to provide a computer having a function set which includes prefixing functions to enable use with variable length operands.

It is a further object of the invention to provide a computer having a function set which includes functions permitting communication betwen more than one process so that a single processor can share its time between a plurality of parallel processes, and effecting scheduling of those processes.

SUMMARY OF THE INVENTION

The present invention provides a computer, which may be a microcomputer, comprising a processor and memory said processor being arranged to execute a number of operations on data in response to a program consisting of a plurality of instructions for sequential execution by the processor, wherein:

(a) each instruction is of the same bit size and has the same format of bit positions, a predetermined set of bit positions being function bits which designate a required function and other predetermined bit positions being data bits which designate data and, (b) said processor includes: (i) a plurality of registers, one of which is an operand register, and data transfer means interconnecting said registers, (ii) temporary store means having a first store location arranged to receive said function bits and a second store location arranged to receive said data bits, (iii) means for loading each instruction in turn into said temporary store, (iv) means for loading said data bits from said second store location into said operand register, and (v) control means for controlling said data transfer means and registers, said control means being arranged to respond to said function bits in said first store location, whereby the processor is arranged to operate in accordance with the function bits of each instruction.

Preferably said control means comprises a micro-instruction program arranged to provide a plurality of selectable output signals in the form of micro-instructions which control said connecting means and registers, and address means responsive to the contents of said first store location and arranged to provide an address signal to the micro-instruction program to select one or more micro-instructions dependent on said address.

Preferably said function bits of each instruction are selected from a set of selectable functions, a plurality of which functions are direct functions in response to which said control means is arranged to cause the process to carry out an operation on the contents of the said operand register.

In response to a direct function, the control means may cause the processor to carry out an operation on contents of one or more other registers in addition to the operand register.

The direct functions included in the function set preferably cover those functions which are most commonly required by the processor and include loading a value into a selected one of the registers, loading into a selected one of the registers a value derived from an address in the memory, and loading into a selected memory address a value derived from one of the registers. The memory address is preferably derived from a pointer to a memory location together with a value in the operand register.

Preferably the function bits of each instruction are represented by four bits so that the function set includes a maximum of sixteen binary coded functions.

Preferably said set of selectable functions includes at least one indirect function in response to which said control means is arranged to cause the processor to carry out an operation determined by the data in said operand register on data held in one or more of the other said registers. This permits a substantial increase in the operations which may be carried out by the processor well in excess of the direct function included in the function set.

Preferably said set of selectable functions includes at least one prefixing function in response to which said control means causes the processor to transfer existing data in said operand register to positions of different significance and add into the operand register data derived from said data bits of the instruction which included the prefixing function.

It will be appreciated that the use of the prefixing function allows the operand register to accumulate variable length operands which may have a bit length well in excess of the bit length of the data bit of each instruction. This enables the microprocessor to operate with an operand register having a word length equal to the word length of the microcomputer whereas the second store location receiving data bits from each instruction has a bit length less than the word length of the microcomputer.

Consecutive instructions may contain a prefixing function followed by an indirect function so as to increase further the number of possible operations by the processor.

In a preferred arrangement the microcomputer has a sixteen bit word length and each instruction consists of eight bits, four bits defining function and four bits defining data.

Preferably the microcomputer includes communication channels to permit input and output of messages by a process executed by the microcomputer. Preferably at least one indirect function is provided for synchronisation of messages through said channel and said control means is arranged in response to an indirect function to locate in a store associated with the channel one or more values representing the state of the channel for use in synchronising purposes.

Preferably the microcomputer comprises a single integrated circuit chip incorporating memory in the form of RAM, a processor and a read only memory in which the micro-instruction program is stored.

It will be understood that the term microcomputer relates to small size computers generally based on integrated circuit devices but it does not impose any limit on how small the computer may be.

An example of a microcomputer in accordance with the present invention will now be described by way of example and with reference to the accompanying drawings.

BRIEF DESCRIPTION OF THE DRAWINGS

FIGS. 9a and 9e illustrate successive operations in one manner of communicating using a two word channel between two processes which are executed by the same microcomputer, FIGS. 13a and 13b illustrate the format of data and acknowledge packets for transmission through serial links between two microcomputers.

FIG. 18 shows an alternative chip formation which may be used for the microcomputer of FIG. 1.

DESCRIPTION OF THE PREFERRED EMBODIMENTS

The microcomputer described herein is an example of a Transputer (Trade Mark of Inmos International plc) microcomputer and comprises a single silicon chip having both a processor and memory as well as links to permit external communication. It is capable of carrying out a plurality of concurrent processes and effecting scheduling and communication between processes both on the same chip or separate chips. Each microcomputer has at least one K byte of memory in the form of programmable RAM on the same chip as the processor and the processor is capable of obeying programs in the chip's memory. The microcomputer has a plurality of communication links, herein called serial links, to enable it to be connected into a network of interconnected microcomputers so that any one microcomputer can be used as a building block for a network. The communication between any two microcomputers is effected by a serial link which provides one or more specific pin to pin connections each interconnecting two and only two microcomputers. Each link is not shared with other microcomputers or with any external memory. The microcomputer is provided with means for synchronisation in data transmission between microcomputers within the network so that communication through a link between two microcomputers can be initiated by either the receiving or transmitting microcomputer.

The microcomputer contains a program with a plurality of sequential instructions each consisting of two parts, one part representing the function of the instruction and the other part representing data which is loaded into an operand register. In this way the function part of each instruction is of the same bit length regardless of the word length of the processor and in this way uniformity of function format and function bit length is achieved regardless of the word length of the processor. A further important feature of the microcomputer is that its operation is effected by use of a function set which is simple and efficient. The function set consists of a minimum number of functions. The function set includes direct functions which cause the processor to carry out an operation on the contents of the operand register. In a preferred arrangement it also includes one indirect function and two prefixing functions. The use of the indirect function allows a large number of processor operations to be used without increasing the number and size of data registers to perform the operations. Furthermore the use of a prefixing function provides for variable length operands.

By use of a microcomputer in accordance with this example, any required network of microcomputers can be formed by interlinking a number of microcomputers and the resulting network operates in the same way as any single microcomputer.

GENERAL DESCRIPTION OF THE STRUCTURE

Figure 1:
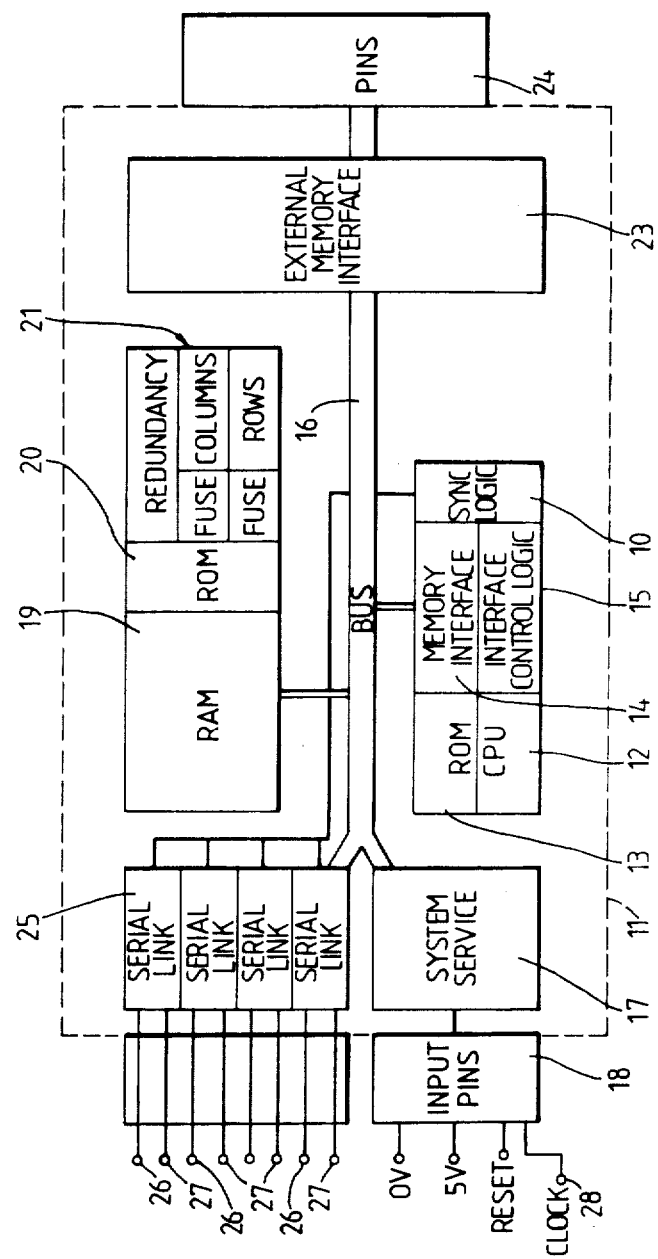
FIG. 1 is a block diagram showing the main features of the microcomputer.
Figure 17:
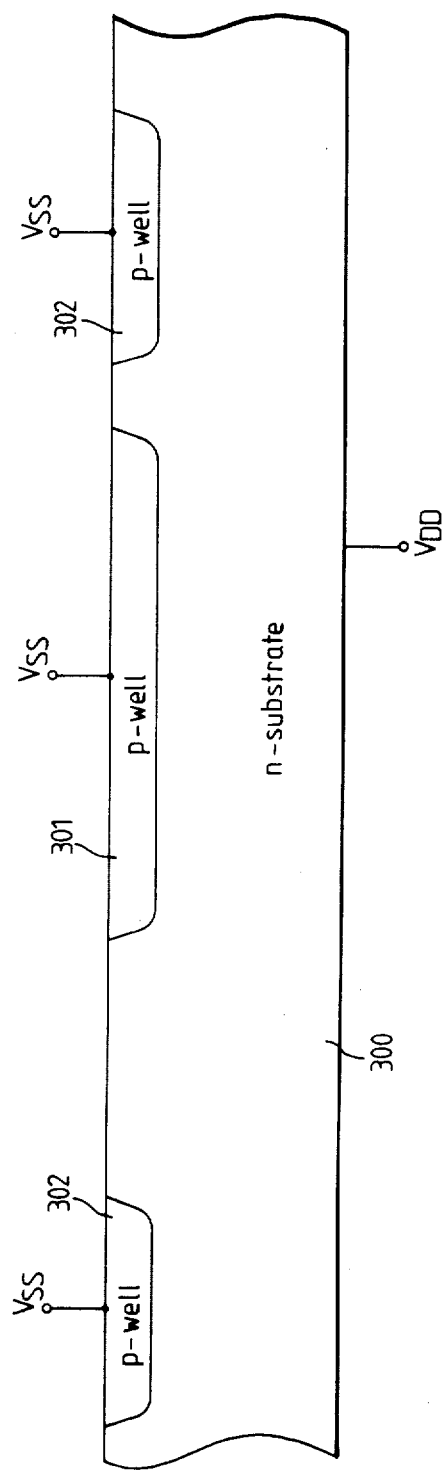
FIG. 17 shows the chip formation which may be used for the microcomputer of FIG. 1.

The main elements of the microcomputer are illustrated in FIG. 1 on a single silicon chip 11 using p-well complementary MOS technology, which will be described in more detail with reference to FIG. 17. The components provided on the chip have been indicated in block form in FIG. 1 although it will be appreciated that the blocks are not intended to represent the relative size and positioning of the various components. On the chip there is provided a central processing unit (CPU) 12 which includes some read-only memory (ROM) 13. The CPU 12 is coupled to a memory interface 14 controlled by interface control logic 15. The CPU 12 incorporates an arithmetic logic unit (ALU), registers and data paths which will be described in more detail with reference to FIG. 3. The CPU 12 and memory interface 14 are connected to a bus 16 which provides interconnection between the elements on the chip 11. A service system 17 is provided with a plurality of input pins 18 including a zero volt supply, a 5 volt supply, a reset pin which may be activated to reset the microcomputer to a defined state, and a clock pin 28. The microcomputer is provided with a substantial amount of memory on the chip 11 and this is represented by a random-access memory RAM 19 and the ROM 20. The amount of memory on the chip should not be less than 1 Kbyte so as to provide sufficient memory capacity to allow the processor 12 to be operated without external memory. Preferably the memory on the chip is at least 4 Kbytes. The division between RAM and ROM on the chip may be selected to suit the particular requirements for the microcomputer. The memory also includes redundancy 21 (this may be as described in U.S. Pat. No. 4,346,459 entitled "Redundancy Scheme For An MOS Memory;" U.S. Pat. No. 4,389,715 entitled "Redundancy Scheme For A Dynamic RAM;" or U.K. Patent application 8231055, all owned by Inmos Corporation. region 21 of memory has rows and columns selectively connectable by fuses as shown to replace defective regions of the memory 19 or 20 and thereby increase the production yield of chips which are satisfactory for use. The operation of the microcomputer includes timing control responsive to clock pulses from the pin 28. An external memory interface 23 is provided and connected to a plurality of pins 24 for connection to an optional external memory (not shown). In order to allow the microcomputer to be linked to other similar microcomputers to form a network, a plurality of serial links 25 are provided and in this example four are shown. Each serial link 25 has an input pin 26 and an output pin 27 each of which can be used to form a single pin to pin connection to corresponding output and input pins respectively of a further microcomputer. Each serial link is connected to a synchronisation logic unit 10 comprising process scheduling logic which will be described in more detail below. Although the drawings show four serial links 25, three links, or even two links, may be used to form a single network but preferably at least six, and for example seven, such links are provided so that they may be fully interconnected in any desired array.

GENERAL DESCRIPTION OF USE OF CHIP MEMORY AND COMMUNICATION CHANNELS AND LINKS

Figure 2:
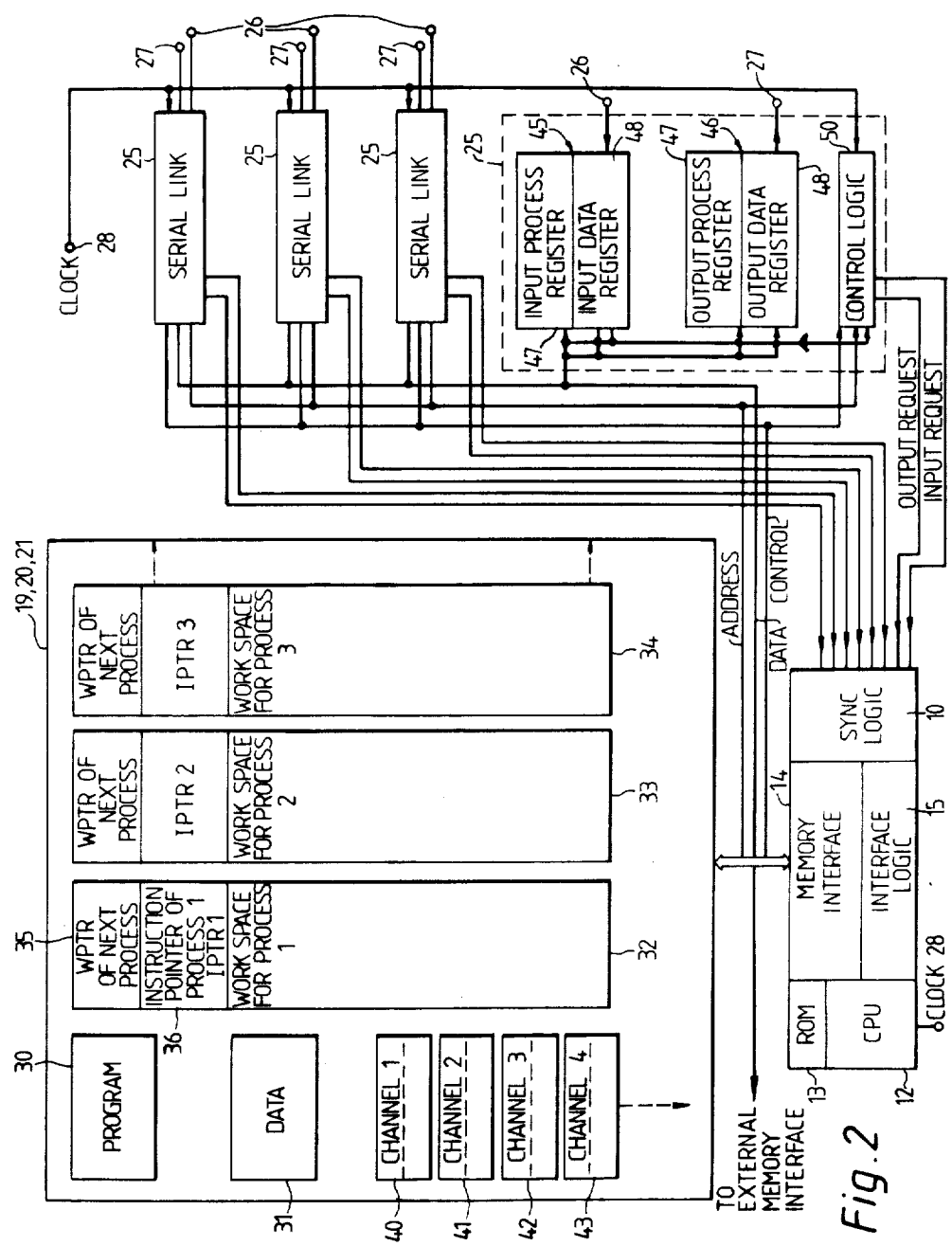
FIG. 2 is as more detailed block diagram of some of the components shown in FIG. 1 and in particular illustrates more fully the memory and serial links for external communication.

FIG. 2 shows some of the elements of the microcomputer in more detail and in particular it illustrates the use of the memory on the chip. The microcomputer may be used to carry out a plurality of concurrent processes on the same chip and in FIG. 2 the operations of three concurrent processes have been shown. The memory is used to store the program 30 which may be stored in either ROM 20 or RAM 19. In this particular example the microcomputer is a 16 bit word device although it will be understood that other word lengths may be used. The program 30 consists of a sequence of instructions which in this example are each of 8 bit length and this instruction length may remain the same even if the processor is of word length other than 16 bits. Each instruction is of the format shown in FIG. 5 where the most significant 4 bits represent the function of the instruction and the least significant 4 bits represent data. The program 30 incorporates no data other than that held in the designated part of each instruction. The manner in which the processor responds to each function and the way in which the data is handled depend on the particular function selected from a set of functions which will be described below, but the format of the function and data parts of each instruction is always the same. The memory also stores data 31 which may be stored in either the ROM 20 or RAM 19.

The microcomputer carries out a number of processes together, sharing its time between them. Processes which are carried out together are called concurrent processes. At any time, only one of the processes is actually being executed by the microcomputer and this process is called the current process. Each concurrent process to be effected by the microcomputer uses a region of memory called a workspace for holding the local variables and temporary values manipulated by the process. The address of the first local variable of each workspace is indicated by a workspace pointer (WPTR). Similarly for each concurrent process, an instruction pointer (IPTR) is used to indicate the next instruction to be executed from the sequence of instructions in the program relating to that particular process. In FIG. 2, which shows three concurrent processes, the workspace for process 1 is indicated by the numeral 32 and the corresponding workspaces for processes 2 and 3 have been marked 33 and 34. Each workspace consists of a plurality of addressable word locations and one word location 35 of each workspace is used to store the workspace pointer (WPTR) of the next process to be executed on a list of processes waiting to be executed. Thus, a linked list is formed in memory containing pointers to a sequence of workspaces for processes to be executed. If the processor is working on process 1 (see FIG. 2) and reaches a point where it is instructed that for the time being it is to stop executing that process, the CPU 12 will begin work on the next process, e.g. process 2. It will be directed to that next process by reading the workspace pointer in memory at location 35. In the preferred embodiment there is a known relationship between workspace pointer for any process and the address of the workspace pointer of the next process on the linked list, so that the next part of the linked list will be easily available from the current process workspace. For each process workspace, a further word location 36 stores the instruction pointer (IPTR) for that process. It will be appreciated that although workspaces for only three processes are shown in FIG. 2, the number may be varied depending on the number of concurrent processes to be carried out.

In order to allow communication between different processes carried out by the same microcomputer, a plurality of communication channels indicated by the numerals 40, 41, 42 and 43 are provided in the RAM section 19 of the memory. In this example each communication channel consists of two word locations in memory, one for use in identifying the process wishing to use the channel and the second for holding the data to be communicated through the channel. The operation of these channels will be described more fully with reference to FIGS. 9a-9e. FIG. 2 also shows in more detail the formation of one serial link 2. It is to be understood that each of the serial links is similarly formed. As indicated, the link 25 incorporates two channels 45 and 46 each forming a uni-directional communication channel. In this way the channel 45 is used as an input channel and the channel 46 as an output channel. Each channel consists of two registers each addressable in a manner similar to the two word locations of each of the channels 40 to 43. The two registers consist of a process register 47 used to indicate the process involved in the communication and a data register 48 for holding the data to be transmitted. The data register 48 in the input channel is connected to pin 26 and the data register 48 in the output channel is connected to pin 27. The operation of the two registers 47 and 48 is controlled by control logic 50 coupled to the synchronisation unit 10. The operation of the serial links, control logic 50 and unit 10 will be described in more detail with reference to FIGS. 12 to 16.

The RAM section 19 of the memory is used to provide the workspaces 32 to 34 as well as the communication channels 40 to 43 and it may also be used for holding the program and data if required. The ROM 20 may be used for a variety of purposes such as for example holding an interpreter for a high level programming language or for storing "look-up" tables for standard operations. It may also be used to hold control programs for peripheral devices where the microcomputer is intended for a specific purpose.

CPU DATA PATHS AND REGISTERS

Figure 3:
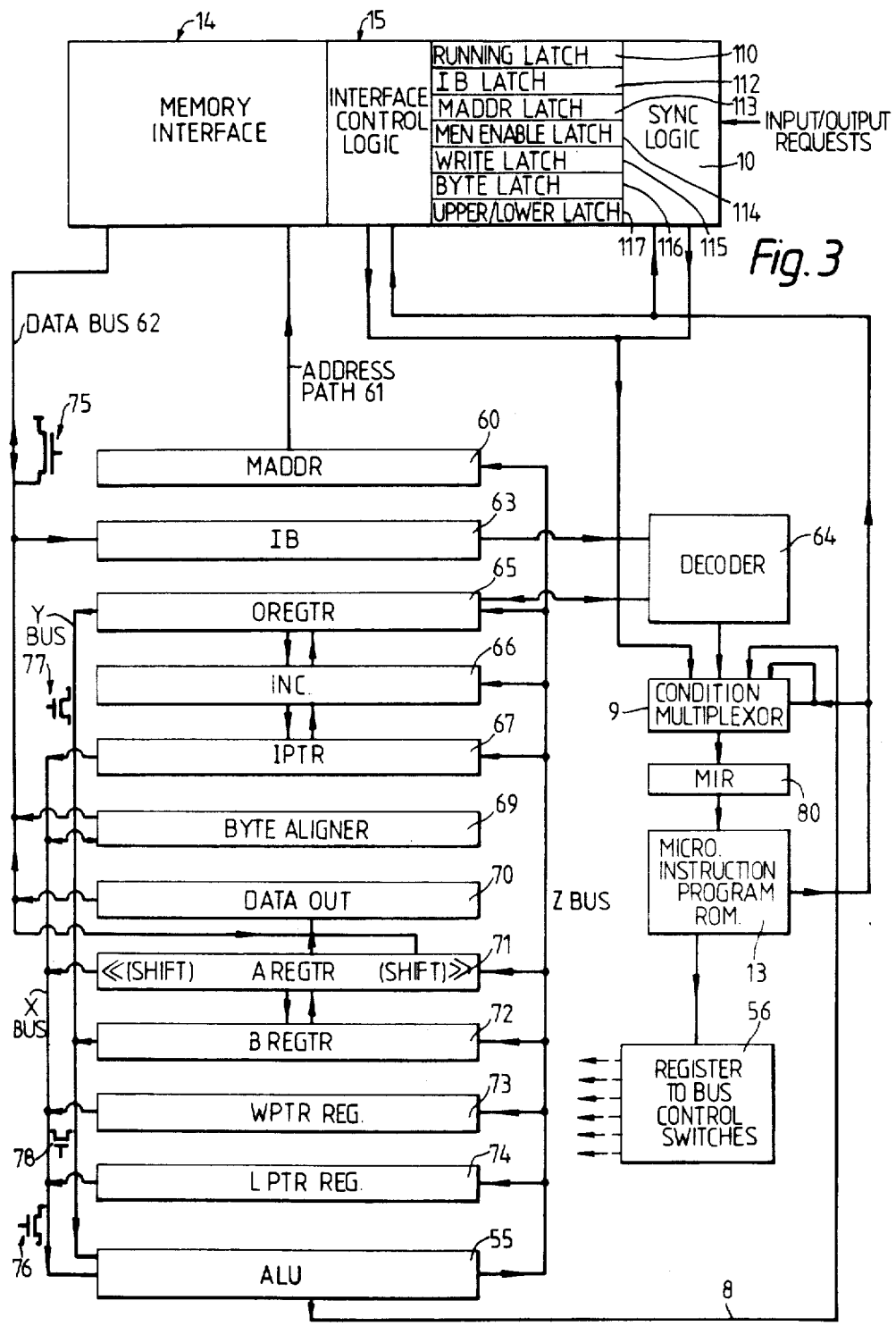
FIG. 3 shows further detail in block diagram form of part of the microcomputer and particularly illustrates the registers, data paths and arithmetic logic unit of the central processing unit as well as the interface between the central processing unit and other units of the microcomputer.

The central processing unit 12 and its operation will be more fully understood with reference to FIG. 3.

Figure 5:
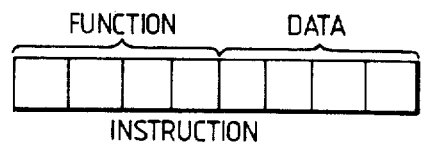
FIG. 5 illustrates schematically a form of instruction used in the microcomputer.

The CPU 12 includes an arithmetic logic unit (ALU) 55 and a plurality of data registers connected to three data buses, X bus, Y bus and Z bus. The operation of the registers and their interconnections with the buses is controlled by a plurality of switches diagrammatically represented by the reference numeral 56 and controlled by signals derived from a micro-instruction program contained in the ROM 13. It will be understood that these are switch means integrally formed in the chip construction. Communication between the CPU and the memory (19, 20, 21) is effected via a unidirectional address path 61 leading to the memory interface 14 and a bidirectional data bus 62 also connected to the interface 14. The registers, buses 61 and 62, and the X, Y and Z buses are connected as shown in FIG. 3. The registers are as follows:

| Abbreviation | Register |
| --- | --- |
| MADDR | Memory address register 60 containing the address of the memory location required. |
| IB | Instruction buffer 63 for receiving sequentially from memory instructions of the form shown in FIG. 5. |
| OREGTR | An operand register 65 for receiving the data derived from an instruction in the instruction buffer 63. |
| IPTR REG | A register 67 which holds the instruction pointer (IPTR) of the current process. |
| DATA OUT | A register 70 for supplying data to the memory on the data bus 62. |
| AREGTR | A first (A) register 71 for holding an operand for the ALU 55. |
| BREGTR | A second (B) register 72 arranged as a stack with the AREG for holding operands for the ALU 55. |
| WPTR REG | A register 73 for holding the workspace pointer (WPTR) of the current process. |
| LPTR REG | A register 74 for holding a pointer to the workspace of the last process on the list of processes waiting to be executed. |

As shown in FIG. 3, an incrementer 66 and a byte aligner 69 are also provided.

The data bus 62 is provided with a switch 75 operable to precharge the data bus line 62. The X and Y buses are respectively provided with similar switches 76 and 77 operable to precharge the X and Y buses. A further switch 78 is provided between the X and Y buses and is operable to cause signals on the two buses to merge.

The arithmetic logic unit 55 receives inputs from both the X and Y buses and is arranged to output to the Z bus. It provides a further output 8 to the micro-instruction program ROM 13, through a condition multiplexor 9, so as to control the operation of the data path in dependence on the output of the ALU 55.

The instruction buffer 63 is arranged to receive from the memory (19, 20, 21) via interface 14 and bus 62 a sequence of 8 bit words, herein called instructions, each of which has the format shown in FIG. 5 and consists of two parts. One part represents a "function" selected from the function set described below and the other part represents data. The instruction buffer 63 provides an output to a decoder 64 which separates the instruction into the function and data halves. The data half is loaded into the operand register 65 and the function half is decoded to provide an address to a micro-instruction register (MIR) 80. The identical procedure is followed for all instructions, regardless of function selected. Each instruction received by the instruction buffer 63 loads into the MIR 80 an address which causes the micro-instruction program in the ROM 13 to execute one or more micro-instructions controlling the switches 56 and interface control logic 15 so that at the end of each sequence of micro-instructions, an operation has been effected by the registers, control logic 15, and data paths of FIG. 3 corresponding to the selected function in the instruction. The operation of the micro-instruction program will be described more fully below.

All the registers shown in FIG. 3 apart from the instruction buffer 63 and the micro-instruction register 80 are 16 bit registers. It will be appreciated that in this example in which the processor is a 16 bit word processor, each 16 bit word location in the program contains two instructions, as each instruction is only 8 bits long. It is therefore necessary for the instruction pointer, which is held in the register 67 to be capable of pointing to a specific 8 bit byte in order to identify a single instruction from a program word location which incorporates two instructions. For this reason the program 30 (FIG. 2), in this example, is written into the bottom half only of the memory 19. In this example the memory has 64K words and consequently the program 30 is written into locations 0 to 32767 as the addresses of these locations can be represented by 15 bits only. This leaves an additional bit in the instruction pointer which can be used to identify which of the two bytes at each word address is necessary in order to identify a specific instruction. The micro-instruction ROM 13 contains 122 words, each of 68 bits. Each row of the ROM 13 contains 68 bits so that the ROM is arranged to provide 68 output signals at any time. The operation of the micro-instruction program will be described more fully below.

As can be seen from FIG. 3, the interface logic controller 15 is provided with a plurality of single bit state latches which are used to record the state of the memory interface. A latch 110, called a running latch, defines the source of instructions to be executed. If the latch 110 has state 1 the source of instructions is memory (this may be an external memory via the external memory interface 23 if desired). If the latch has state 0, the source of instructions is one of the serial links 25 to allow instructions to be received from an external source. It may be necessary to go repeatedly to the same serial link 25 for two or more successive instructions whereas when the instructions are derived from memory, the instruction pointer IPTR Is advanced for each instruction. An IB latch 112 records the state of the IB register 63. An MADDR latch 113 records the state of the MADDR register. A MEM ENABLE latch 114 records the state of the memory interface and has state 1 whenever the memory interface 14 is occupied. A WRITE latch 115 records that a write request has been made to the memory. The BYTE latch 116 records that a byte request has been made to the memory. An UPPER/LOWER latch 117 holds the least significant bit of byte addresses and is loaded from the least significant bit of the A register 71 when the content of the A register is shifted one place to the right.

FUNCTION SET

The function elements of the instructions which are received by the instruction buffer 63 are determined by the function set for the microcomputer. The function set is the list of available functions which can be selected when writing a program and to which the microcomputer is capable of responding.

There are three types of function in the function set.
Direct functions which use the contents of the operand register 65 as data (the contents of other registers may also be used as data).
Indirect functions which use the contents of the operand register 65 to select one of a variety of "operations" using data in registers other than the operand register 65. The selectable "operations" are listed below the function set.
Prefixing functions which accumulate operands into the operand register 65.

The function set is as follows:

| Code No | Abbreviation | Name |
|---------|--------------|------|
| | | FUNCTIONS |
| | | Direct Functions |
| 0 | ldw | load from workspace |
| 1 | stw | store to workspace |
| 2 | ldpw | load pointer into workspace |
| 3 | ldwi | load from workspace and increment |
| 4 | ldv | load from vector |
| 5 | stv | store to vector |
| 6 | ldl | load literal |
| 7 | adl | add literal |
| 8 | j | jump |
| 9 | jnz | jump non zero |
| 10 | ldpc | load pointer into code |
| 11 | call | call procedure |
| | | INDIRECT FUNCTIONS |
| 13 | opr | operate |
| | | PREFIXING FUNCTIONS |
| 14 | pfix | prefix |
| 15 | nfix | negative prefix |

The operations which may be effected by use of indirect functions are as follows:

| | OPERATIONS | |
|---|---|---|
| Code No | Abbreviation | Name |
| 0 | rev | reverse |
| 1 | eqz | equal to zero |
| 2 | gt | greater |
| 3 | and | and |
| 4 | or | or |
| 5 | xor | exclusive or |
| 6 | add | add |
| 7 | sub | subtract |
| 8 | run | run process |
| 9 | pse | pause |
| 10 | join | join |
| 11 | sync | sychronise |
| 12 | ret | return |
| 13 | rot | rotate bytes |
| 14 | sr | shift right |
| 15 | sl | shift left |

Prior to describing these functions and operations, the notation which is used herein will be set forth. The Transputer microcomputer is used preferably with OCCAM (Trade Mark of Inmos International plc) language, which is set forth more particularly in the booklet entitled *Programming Manual-OCCAM* published and distributed by Inmos Limited in 1983 in the United Kingdom, a copy of which is attached to this specification as *Appendix* 1 as well as Taylor and Wilson, "Process-Oriented Language Meets Demands of Distributed Processing", *Electronics* (Nov. 30, 1982), both of which are hereby incorporated herein by reference. OCCAM language is particularly well suited to concurrent processing. Because the preferred embodiment is particularly suitable for concurrent processing, the use of OCCAM language with the present example is quite appropriate.

Other languages can be used with an appropriate compiler. In actual application, the programmer will write a program using OCCAM language and a compiler will convert this to particular instructions in customary fashion. Nevertheless, the functions and operations in the instructions are susceptible of description using OCCAM language to show what happens within the preferred embodiment of the microcomputer described herein. Thus, in describing these functions and operations, as well as examples of use, the following notation will be used:

NOTATION

1. PROCESS

A process starts, performs a number of actions, and then terminates. Each action may be an assignment, an input or an output. An assignment changes the value of a variable, an input receives a value from a channel, and an output sends a value to a channel.

At any time between its start and termination, a process may be ready to communicate on one or more of its channels. Each channel provides a one way connection between two concurrent processes; one of the processes may only output to the channel, and the other may only input from it.

An assignment is indicated by the symbol ":=". An assignment $$v := e$$

sets the value of the variable v to the value of the expression e and then terminates. For example, $x := 0$ sets x to zero, and $x := x+1$ increases the value of x by 1.

An input is indicated by the symbol "?". An input $$c \: ? \: x$$

inputs a value from the channel "c", assigns it to the variable x and then terminates. An input $$c \: ? \: ANY$$

inputs a value from the channel "c", and discards the value.

An output is indicated by the symbol "!". An output $$c \: ! \: e$$

outputs the value of the expression e to the channel "c" and then terminates. An output $$c \: ! \: ANY$$

outputs an arbitrary value to the channel "c".

The process SKIP terminates with no effect.

2. CONSTRUCT

A number of processes may be combined to form a sequential, parallel, conditional or alternative construct. A construct is itself a process, and may be used as a component of another construct. Each component process of a construct is written two spaces further from the left hand margin, to indicate that it is part of the construct.

A sequential construct is represented by

SEQ
  P1
  P2
  P3

The component processes P1, P2, P3 ... are executed one after another. Each component process starts after the previous one terminates and the construct terminates after the last component process terminates. For example SEQ
  in ? x
  x := x+1
  out ! x inputs a value, adds one to it, and then outputs the result.

A parallel construct is represented by

PAR
  P1
  P2
  P3
  ...

The component processes P1, P2, P3 ... are executed together, and are called concurrent processes. The construct terminates after all of the component processes have terminated. For example, PAR
  in ? x
  out ! y allows an input to x and output from y to take place together.

Concurrent processes communicate using channels. When an input from a channel "c", and an output to the same channel "c" are executed together, communication takes place when both the input and the output are ready. The value is assigned from the outputting process to the inputting concurrent process, and execution of both concurrent processes then continues.

A conditional construct

IF
  condition 1
    P1
  condition 2
    P2
  condition 3
    P3
  ...

means that process P1 is executed if condition 1 is true, otherwise process P2 is executed if condition 2 is true, and so on. Only one of the processes is executed, and the construct then terminates. For example IF
  x >= 0
    y := y+1
  x < 0
    SKIP increases y only if the value of x is positive.

An alternate construct

ALT
  input 1
    P1

```
    input 2
        P2
    input 3
        P3
    . . .
``` waits until one of input 1, input 2 . . . is ready. If input 1 first becomes ready, input 1 is performed, and then process P1 is executed. Similarly, if input 2 first becomes ready, input 2 is performed, and then process P2 is executed. Only one of the inputs is performed, and then the corresponding process is executed and the construct terminates. For example:

```
ALT
    count ? ANY
        counter := counter+1
    total ? ANY
        SEQ
            out ! counter
            counter := 0
``` either inputs a signal from the channel "count", and increases the variable "counter" by 1, or alternatively inputs from the channel "total", and outputs the current value of the variable "counter", and resets it to zero.

3. REPETITION

```
WHILE condition
    P
``` repeatedly executes the process P until the value of the condition is false. For example

```
WHILE x > 5
    x := x−5
``` decreases x by 5 until its value is less than 5.

4. VARIABLES

A variable is either a simple variation, corresponding to a single word in store, or is one of a numbered set of variables called a vector. For example, v [3] := 0 sets the value of variable number 3 in the vector v to 0, and v[0]+1 increases the value of variable number 0 by 1.

A variable is introduced by a declaration such as

```
VAR v :
P
``` which introduces v for use in the process P.

5. PROCEDURES

A procedure definition allows a process to be given a name. For example

```
PROC square (n, sqr)
    sqr := n * n
``` defines the procedure "square".

The procedure name may be used as an abbreviation for the process. For example

```
square (x, sqrx)
``` means

```
sqrx := x * x
```

6. EXPRESSIONS

An expression is constructed from operators, variables, numbers, the truth values TRUE and FALSE and the brackets (and).

TRUE is a value consisting entirely of 1 bits, and FALSE is a value consisting entirely of 0 bits.

The operators +, −, *, / represent addition subtraction, multiplication and division as usual.

For the operators =, < >, > and < =, the result is produced as shown below:

| | |
|---|---|
| x = y | true if x is equal to y |
| x < > y | true if x is not equal to y |
| x > y | true if x is greater than y |
| x < = y | true if x is less than or equal to y |

For the operators $\vee$ , $\wedge$ and $><$, each bit of the result is produced from the corresponding bits of the operands according to the following table:

| x | y | x $\vee$ y | x $\wedge$ y | x $><$ y |
|---|---|---|---|---|
| 0 | 0 | 0 | 0 | 0 |
| 0 | 1 | 1 | 0 | 1 |
| 1 | 0 | 1 | 0 | 1 |
| 1 | 1 | 1 | 1 | 0 |

For the NOT operator, each bit of the result is produced from the corresponding bit of the operand, according to the following table:

| x | NOT x |
|---|---|
| 0 | 1 |
| 1 | 0 |

For the operators $<<$ and $>>$ $x << y$ is the value of x moved y bits to the left, vacated bit positions being filled with 0 bits $x >> y$ the value of x moved y bits to the right, vacated bit positions being filed with 0 bits The above general OCCAM language notation will now be applied to the microcomputer of the example.

The register variables are defined as follows:

IPTR represents the contents of the instruction pointer register 67
WPTR represents the contents of the workspace pointer register 73
LPTR represents the contents of the list pointer register 74
AREG represents the contents of the A register 71
BREG represents the contents of the B register 72
OREG represents the contents of the operand register 65

A transfer from one register to another is represented by an assignment, eg:

```
BREG := AREG
``` which means that the contents of the A register are copied to the B register, replacing the previous contents of the B register.

The memory in the transputer is represented by a vector:

```
memory
```

An individual word in memory is identified by subscripting the vector eg:

memory [ AREG ]

which means the contents of the word in memory whose address is the contents of the A register.
A transfer between memory and a register is similarly represented by an assignment eg:

memory [ AREG ] := WPTR which means that the contents of the word in memory whose address is the contents of the A register is replaced by the contents of the workspace pointer register.

Three procedures (PROC) "run", "wait" and "moveto" occur frequently in the following description. They are used in scheduling and will be explained below in connection with scheduling. Meanwhile, they are defined as follows, wherein link [process] represents the contents of the process register 47 of a serial link 25 and NIL represents a special value which is not the workspace pointer of any process. READY represents a further special value used by the serial links:

```
1  PROC run (w)
2     IF
3        w <> READY
4           SEQ
5              memory [LPTR − 2] := w
6              LPTR := w
7        w = READY
8           SKIP
1  PROC wait
2     SEQ
3        memory [WPTR − 1] := IPTR
4        for each external request from a serial link
5           SEQ
6              run (link [process])
7              link [process] := NIL
8        WPTR := memory [WPTR − 2]
9        IPTR := memory [WPTR − 1]
1  PROC moveto (w)
2     SEQ
3        IF
4           WPTR = LPTR
5              LPTR := w
6           WPTR <> LPTR
7              memory [w − 2] := memory [WPTR − 2]
8        WPTR := w
```

In the above procedures, line numbers have been added for reference purposes in explanation which will be given below.

Function and Operation Definitions

These are now set out below using the notation defined above. These will be further explained below in connection with FIG. 4 and scheduling.

load from workspace (function code 0)
Definition: SEQ
    BREG := AREG
    AREG := memory [WPTR + OREG]
Purpose: to load into the A register the value of a location in the current process workspace.

store to workspace (function code 1)
Definition: SEQ
    memory [WPTR + OREG] := AREG
    AREG := BREG
Purpose: to store a value in a location in the current process workspace.

load pointer into workspace (function code 2)
Definition: SEQ
    BREG := AREG
    AREG := WPTR + OREG
Purpose: to load into the A register a pointer to a location in the current process workspace
to load a pointer to the first location of a vector of locations in the current process workspace.

load from workspace and increment (function code 3)
Definition: SEQ
    BREG := *AREG
    AREG := memory [WPTR + OREG]
    memory [WPTR + OREG] := AREG + 1
Purpose: to load into the A register the value of a location in the current process workspace, and increment the location
to facilitate the use of workspace locations as loop counters, incrementing towards zero
to facilitate the use of workspace locations as incrementing pointers to vectors of words or bytes.

load from vector (function code 4)
Definition: AREG := memory [AREG + OREG]
Purpose: to load into the A register a value from an outer workspace
to load a value from a vector of values
to load a value, using a value as a pointer (indirection) - in this case OREG = 0 store to vector (function code 5)
Definition: SEQ
    memory [BREG + OREG] := AREG
    AREG := BREG
Purpose: to store a value in a location in an outer workspace
to store a value in a vector of values
to store a value, using a value as a pointer (indirection) - in this case OREG = 0 load literal (function code 6)
Definition: SEQ
    BREG := AREG
    AREG := OREG
Purpose: to load a value add literal (function code 7)
Definition: AREG := AREG + OREG
Purpose: to add a value
to load a pointer to a location in an outer workspace
to load a pointer to a location in a vector of values jump (function code 8)
Definition: IPTR := IPTR + OREG
Purpose: to transfer control forward or backwards, providing loops, exits from loops, continuation after conditional sections of program jump non zero (function code 9)
Definition: IF
    AREG <> 0
       IPTR := IPTR + OREG
    AREG = 0
       SKIP
Purpose: to transfer control forwards or backwards only if a non-zero value is loaded, providing conditional execution of sections of program and conditional loop exits
to facilitate comparison of a value against a set of values load pointer into code (function code 10)
Definition: SEQ
    BREG := AREG
    AREG := IPTR + OREG
Purpose: to load into the A register the address of an instruction to load the address of a vector of data
forming part of the program call procedure (function code 11)

Definition: SEQ
    memory [WPTR − 1] := IPTR
    IPTR := AREG
    AREG := WPTR
    moveto (WPTR + OREG)

Purpose: to provide an efficient procedure
call mechanism
to facilitate code sharing, where
two identical procedures are
executed on the same processor Indirect Functions (function code 13)

operate

Definition: operate (OREG)
Purpose: perform an operation, using the
contents of the operand register
(OREG) as the code defining the
operation required.

Prefixing Functions prefix (function code 14)

Definition: OREG := OREG << 4
Purpose: to allow instruction operands which
are not in the range 0-15 to be
represented using one or more prefix
instructions negative prefix (function code 15)

Definition: OREG := (NOT OREG) << 4
Purpose: to allow negative operands to be
represented using a single negative
prefix instruction followed by zero
or more prefix instructions.

Operations (function code 13)

reverse (operation code 0)

Definition: SEQ
    OREG := AREG
    AREG := BREG
    BREG := OREG

Purpose: to exchange the contents of the A
and B registers
to reverse operands of asymmetric
operators, where this cannot
conveniently be done in a compiler equal to zero (operation code 1)

Definition: IF
    AREG = 0
        AREG := TRUE
    AREG <> 0
        AREG := FALSE Purpose: to test that A holds a non zero value
to implement logical (but not
bitwise) negation
to implement
    A = 0        as eqz
    A <> 0      as eqz, eqz
    if A = 0 . . .  as jnz
    if A <> 0 . . . as eqz, jnz greater (operation code 2)

Definition: IF
    BREG > AREG
        AREG := TRUE
    BREG <= AREG
        AREG := FALSE Purpose: to compare A and B (treating them as
twos complement integers), loading
−1 (true) if B is greater than A, 0
(false) otherwise
to implement B < A by reversing
operands
to implement B <= A as (gt, eqz),
and B >= A by reversing operands and
(gt, eqz)

and (operation code 3)

Definition: AREG := AREG ∧ BREG
Purpose: to load the bitwise AND of A and B,
setting each bit to 1 if the
corresponding bits in both A and B
are set to 1, 0 otherwise
to logically AND two truth values or (operation code 4)

Definition: AREG := BREG ∨ AREG
Purpose: to load the bitwise OR of A and B,
setting each bit to 1 if either of
the corresponding bits of A and B is
set, 0 otherwise
to logically OR two truth values exclusive or (operation code 5)

Definition: AREG := BREG >< AREG
Purpose: to load the bitwise exclusive OR of
A and B setting each bit to 1 if the
corresponding bits of A and B are
different, 0 otherwise
to implement bitwise not as
(ldl −1, xor)

add (operation code 6)

Definition: AREG := BREG + AREG
Purpose: to load the sum of B and A
to compute addresses of words or
bytes in vectors subtract (operation code 7)

Definition: AREG := BREG − AREG
Purpose: to subtract A from B, loading the
result
to implement
    A = B      as sub, eqz
    A <> B     as sub, eqz, eqz
    if A = B   as sub, jnz, . . .
    if A <> B  as sub, eqz, jnz, . . .

run process (operation code 8)

Definition: SEQ
    memory [AREG − 1] := BREG
    run (AREG)

Purpose: to add a process to the end of the
active process list pause (operation code 9)

Definition: SEQ
    run (WPTR)
    wait ( )

Purpose: to temporarily stop executing the
current process
to share the processor time between
the processes currently on the
active process list join (operation code 10)

Definition: IF
    memory [AREG] = 0
        moveto (memory [AREG + 1])
    memory [AREG] <> 0
        SEQ
            memory [AREG] := memory [AREG] − 1
            wait ( )

Purpose: to join two parallel processes; two words
are used, one being a counter, the other a
pointer to a workspace. When the count
reaches 0, the workspace is changed synchronise (operation code 11)

Definition: IF
    memory [AREG] = NIL
        SEQ
            memory [AREG] := WPTR
            wait ( )
    memory [AREG] <> NIL
        SEQ
            run (memory [AREG])
            memory [AREG] := NIL Purpose: to allow two processes to
synchronise and communicate using a
channel return (operation code 12)

Definition: SEQ
    moveto (AREG)
    IPTR := memory [WPTR − 1]
    AREG := BREG Purpose: to return from a called procedure rotate bytes (operation code 13)

Definition: AREG := (AREG << 8) ∨ (AREG >> (bitsperword − 8))
Purpose: to rotate the bytes in the A register -continued > to allow 8 bit byte values to be combined
> to form a single word value
> to allow a word value to be split into several
> component 8 bit values shift right (operation code 14)
> Definition: AREG := AREG >> 1
> Purpose: to shift the contents of the A
> register one place right shift left (operation code 15)
> Definition: AREG := AREG << 1
> Purpose: to shift the contents of the A
> register one place left It will be seen that the above function set includes direct functions, indirect functions and prefixing functions. At the start of execution of any instruction, regardless of the function selected for that instruction, the predetermined set of bit positions in the instruction buffer 63 which receive the function part of the instruction are used to provide an input to the decoder 64 whereas the other predetermined bit positions in the instruction buffer 63 which represent the data part of each instruction are used to load the least significant four bit positions of the operand register 65. If the function is a direct function, the processor then acts in accordance with the selected function on the contents of the operand register 65. If the function is an indirect function, the contents of the operand register 65 are used to determine the nature of the operation to be carried out and the operation is effected on data held in other registers. At the end of any instruction in which the function is direct or indirect, the operand register 65 is cleared to zero. If the function is a prefix function, the processor operates to transfer existing data in the operand register 65 to positions of higher significance and then load into the vacated positions of lower significance data derived from the data part of the instruction.

At the start of each instruction, the instruction pointer is incremented. Consequently the instruction pointer always points to the next instruction to be executed. As mentioned, the instruction pointer IPTR is stored in register 67.

The operand register 65 is used for several different purposes. The "data" which it receives with each instruction may be a literal value for use in a computation or in the case of an indirect function, it is the definition of the required operation. A further important use is that for some functions, the data value in the operand register 65 will be combined with the data in the workspace pointer register 73 to locate an address where the value of a particular variable is to be found or to be stored. For example, the workspace pointer register 73 will contain the workspace pointer WPTR of the current process. This points to a reference memory address for the workspace. Variables or other pointers will be defined and stored in that workspace at address locations which are offset by known amounts from the address pointed to by the workspace pointer WPTR. That offset will generally be specified by an instruction portion and stored in operand register 65. Indeed, the load and store from workspace instructions will implicitly refer to a memory location defined by the combination (illustratively the additive sum) of the contents of WPTR register 73 and the operand register 65. Furthermore, the contents of the operand register 65 will be combined with the contents of other registers such as the A register 71 or the IPTR register 67, for accessing vectors or for branching in the program. Examples of this will be given below.

It will be seen that the direct functions are selected to cover the most commonly required actions within the microcomputer in order to maximise efficiency of operation. By using 4 bits to represent the function element of each instruction, the function set uses codes 0 to 15 although no function has been allocated to code 12. Code 13 is used to indicate the indirect function which in this case is the "operate" function causing the least significant 4 bits of the instruction to be loaded into the operand register 65 in the usual way but the contents of that operand register are then used by the processor to determine an operation on data held in other registers. It will be appreciated that in this way the number of operations can be extended whilst maintaining uniformity of an 8 bit instruction. By use of the prefix or negative prefix functions before the "operate" instruction, the contents of the operand register 65 can be varied to provide a much greater selection of operations than is set out above. The use of pfix and nfix will be described in more detail below with reference to FIG. 8 but first it is necessary to describe further the operation of the micro-instruction program 13.

The micro-instruction program is the means of generating control signals which control the switches 56 and inferface control logic 15 (FIG. 3) in order to carry out the required "function" of each sequential instruction arriving in the instruction buffer 63 from the microcomputer program. The micro-instruction program consists of a list of micro-instructions stored in rows and columns in the ROM 13. The ROM 13 provides an output, called a micro-word, which may consist of 68 bits each providing a control signal and divided up into a plurality of different fields, each field consisting of a predetermined group of bit positions. The output at any one time is provided at selected bit positions depending on the micro-instruction selected. Each field may relate to a specific area of control, such as for example, one field controls which register is connected to the X bus, another field controls which register is connected to the Y bus, another field controls which register is connected to the Z bus, another field controls the action of the ALU 55 and another field controls feed back signals to the multiplexor 9 and MIR 80. One field controls the interface control logic 15 and provides micro-instruction output signals such as "Read", "Write" and "Next instruction required (NEXT)" to allow the microprogram to control communication between registers and the memory 19 through the interface 14.

The particular micro-instruction selected in the ROM 13 depends on the address in the MIR 80, which is a 7 bit register providing a row and column selection in the ROM 13. At the beginning of each instruction received by the instruction buffer 63 the "function" is decoded by the decoder 64 and is passed through the condition multiplexor 9 to provide an address for selection of the micro-instruction in the ROM 13. Some functions may require only one micro-instruction to carry out the function, in which case the ROM 13 provides a microword output dependent on the address decoded by the decoder 64 and the function is completed in one cycle of operation, herein called a minor cycle, of the ROM 13. Other functions require a succession of micro-instructions, and therefore minor cycles. In this case, the decoder 64 provides the MIR 80 with an address for the ROM 13 to select the first micro-instruction necessary for that function. Thereafter the micro program proceeds to execute a sequence of micro-instructions, each taking one minor cycle, and each micro instruction provides in a field of its output micro-word 7 bits for the MIR 80 so as to identify the address of the next micro instruction to be executed in the sequence. The least significant two bits of the MIR 80 may be conditionally set, so that the next minor instruction is selected as a result of conditions produced by a previous minor cycle, and fed back through the multplexor 9 to effect the address in the MIR 80. This allows the next micro-instruction to be selected from four possible options depending on for example the values in the various registers shown in FIG. 3. If the two conditional bits of the MIR 80 are not set conditionally then the next micro-instruction indicated by the address in the MIR 80 is unconditionally executed. When all micro-instructions have been executed in order to achieve operation of the instruction in the instruction buffer 63, the control signal "NEXT" is generated in a field of the micro-word output of the ROM 13, thereby demanding the next instruction from the memory 19 to the instruction buffer 63.

Figure 7:
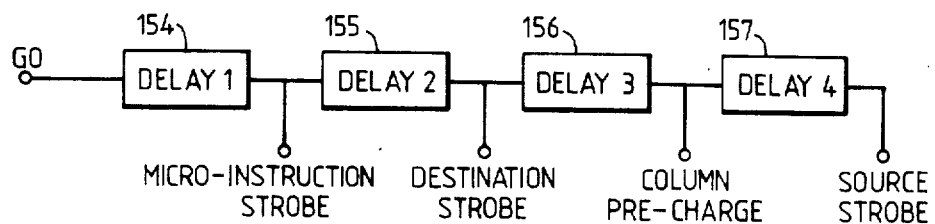
FIG. 7 illustrates the generation of timing control signals.
Figure 6:
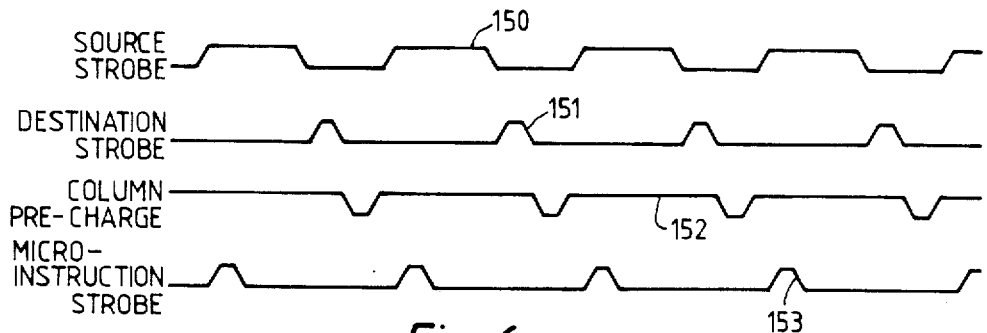
FIG. 6 shows in wave form the relative timing and duration of a plurality of timing control signals.

Each minor cycle consists of two phases, a source phase and a destination phase. The control signals generated from the ROM 13 fall into three groups; those which are active only during the source phase, those which are active only during the destination phase and those which are active throughout the whole minor cycle. In order to control the occurrence and duration of the control signals, the timing control is arranged to provide four different strobe signals indicated in FIG. 6. These are a source strobe 150, a destination strobe 151, a column percharge strobe 152 and a micro-instruction strobe 153. The source strobe is a timing signal which allows a register to place its contents onto a bus and its duration is long enough to allow the arithmetic logic units to form a result. The destination strobe signals are arranged to allow registers to accept data from a bus. The micro-instruction strobe is used to generate the address of the next micro-instruction from the condition multiplexor 9. The column percharge strobe is used to precharge the bus lines X and Y to a high state ready for the next source strobe. The relative timing and duration of these strobes is shown in FIG. 6. They are generated by the arrangement shown in FIG. 7. The clock pulses from pin 28 (FIG. 1) generate a GO signal for the beginning of each minor cycle. This signal is passed through four successive delay units within the CPU 12 so that the micro-instruction strobe 153 is derived from the output of the first delay unit 154, the destination strobe 151 is derived from the output of the second delay unit 155, the column percharge signal 152 is derived from the output of the third delay unit 156 and the source strobe 150 is derived from the output of the fourth delay unit 157. The operation of the processor is therefore synchronised to the external clock input 28.

USE OF VARIABLE LENGTH OPERANDS

Figure 8:
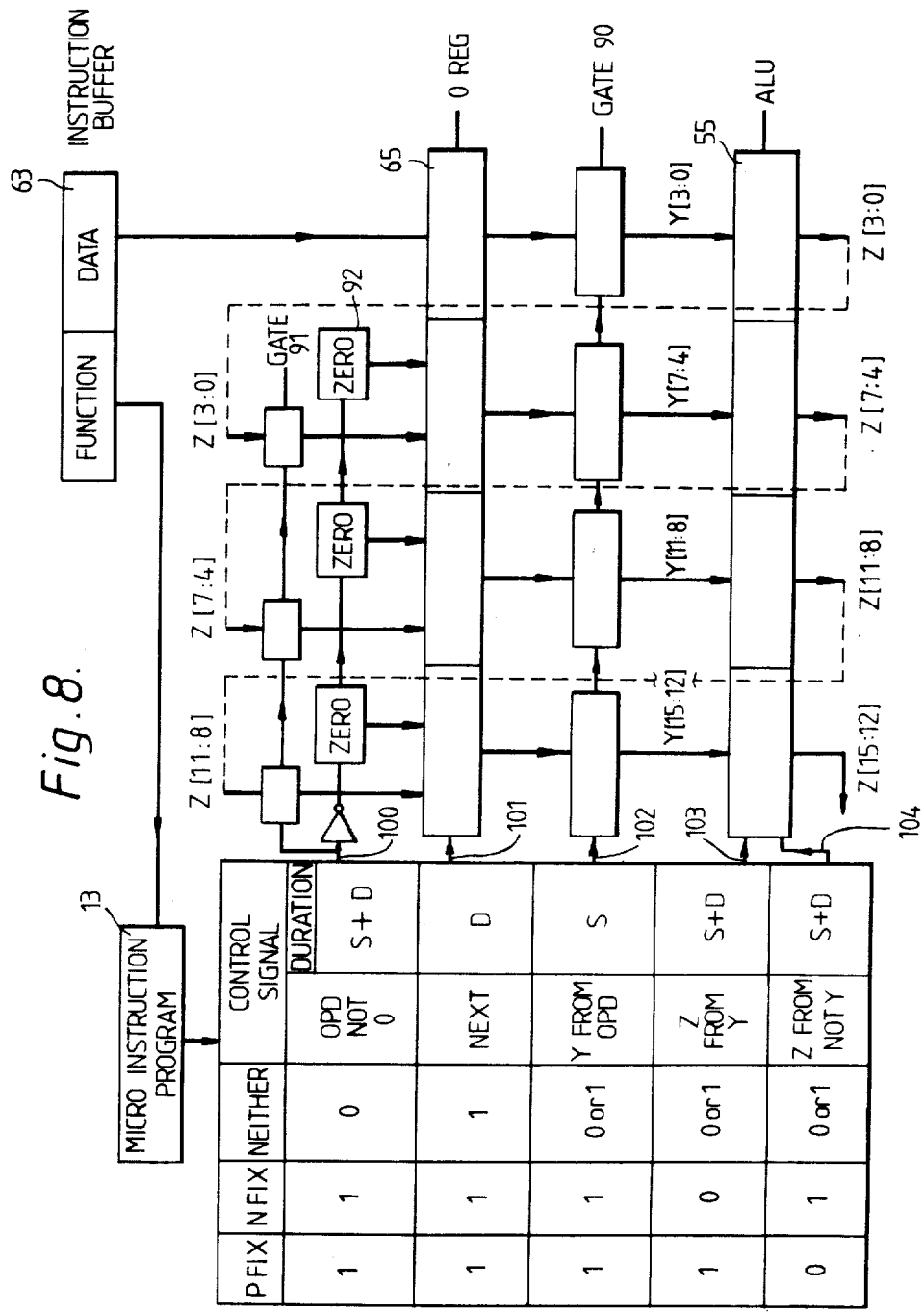
FIG. 8 illustrates the operation of the microcomputer of FIGS. 1 to 3 with variable length operands.

As already explained above, the microcomputer is capable of operating with a variable length operand. Although each instruction allocates 4 bit locations to an operand, it is possible to build up in the operand register 65 an operand up to 16 bits by use of the functions pfix and nfix corresponding to codes 14 and 15 in the function set set out above. This operation can best be understood with reference to FIG. 8. This indicates the operand register 65 having four sections each with 4 bits. The arithmetic logic unit 55 is indicated having four sections corresponding to 4 bits of increasing significance and the connection between the 0 register 65 and the arithmetic logic unit 55 is controlled via a gate 90 selectively controlling transmission through the Y bus to the arithmetic logic unit. The Y and Z buses are each shown separated into four parts, each handling four bits of data of different significance, e.g. Y[3:0] represents the part of the Y bus handling the four digits of least significance whereas Y[15:12] handles the four digits of greatest significance, and similarly for the Z bus. Each section of the operand register 65 other than the least significant 4 bits, can be supplied through a gate 91 from the Z bus or alternatively it can be fed with a zero from the gate 92. The instruction from the instruction buffer 63 in FIG. 8 is divided so that the least significant 4 bits are fed to the least significant 4 bit position of the 0 register 65 and the function element is used to select an address in the micro-instruction program 13 as previously described with reference to FIG. 3. The truth table of FIG. 8 indicates three alternative possibilities where the function corresponds to pfix or nfix or neither. It also lists the corresponding control signals which are fed onto lines 100 to 104 from the micro-word output of the ROM 13, and the duration of those signals.

The micro-word output control signals used in this case are as follows:

1. OPD NOT 0—meaning that the operand register 65 is not supplied with zeroes if the truth table has a "1" but is supplied with zeroes if the truth table has a "0".
2. NEXT—meaning that the operand register 65 will be loaded with the next operand from the instruction buffer 63 if the truth table has a "1" but not if the truth table has a "0".
3. Y FROM OPD—meaning that the Y bus receives the operand from the operand register 65 if the truth table has a "1" but not if the truth table has a "0".
4. Z FROM Y—meaning that the Z bus output from the ALU 55 will receive data from the Y bus if the truth table has a "1", but not if the truth table has a "0".
5. Z FROM NOT Y—meaning that the ALU 55 will cause the signal on the Y bus to be inserted and passed to the Z bus if the truth table has a "1" but not if the truth table has an "0".

The duration of these five control signals in each minor cycle is indicated in FIG. 8 wherein S indicates duration in the source phase only, D indicates duration only in the destination phase and S+D indicates duration in both.

The micro-word control signal on line 100 operates the gates 91 and 92 to allow the Z bus to unload into the operand register 65 in response to the functions pfix and nfix whereas any other function causes the three most significant stages of the operand register 65 to be zeroed by an input through the gate 92. All instructions generate the control signal NEXT on the last minor cycle and this is applied to line 101 to cause the operand register 65 to be loaded with the next operand. Line 102 receives the signal "Y FROM OPD" and causes the operand register to be connected through the gate 90 to the Y bus for both pfix and nfix. Line 113 receives the control signal "Z FROM Y" and causes the arithmetic logic unit 55 to transmit to the Z bus the signal on the Y bus for pfix but not for nfix. Line 104 receives "Z FROM NOT Y" and allows the signal on Y to be inverted and supplied through the ALU 55 to the Z bus for nfix but not for pfix. The signals on lines 100, 103 and 104 exist throughout the source and destination phases of each minor cycle whereas the signal on line 101 exists only in the destination phase and the signal on line 102 exists only in the source phase. When the function is pfix, it can be seen that signals corresponding to a truth condition are supplied on lines 100, 101, 102 and 103 and in this way, the 4 bits of operand in the least significant section of the operand register 65 are advanced through the arithmetic logic unit to the next significant stage of the operand register 65 thereby allowing a further 4 bits of operand to be loaded into the least significant positions of the operand register 65. This operation is repeated each time an instruction is derived with pfix function up till a maximum of 16 bits of operand. Similarly if the function is nfix, the process is generally similar in allowing each successive 4 bits of operand to be moved up into a higher stage of the 0 register 65 without zeroes being written in after each instruction. This allows a negative operand to be built up to a maximum of 16 bits. The truth table indicates that if the function is neither pfix nor nfix, the control signal on line 100 causes zeroes to be fed into the three upper significant stages of 0 register 65 (representing bits 15 to 4) at the end of that instruction.

SCHEDULING OF PROCESSES

As already indicated, the micrcomputer may operate a number of concurrent processes. It therefore provides a system of scheduling to determine which process shall be performed at any particular time. At any one time the WPTR register 73 (FIGS. 3 and 4) holds the workspace pointer of the process currently being executed. However the workspace of the current process and the workspaces of other processes waiting to be executed form a list in which one location of each workspace holds the workspace pointer of the next process on the list. Another location in each process workspace holds the instruction pointer identifying the next instruction which is to be carried out for that process when it becomes the current process. Furthermore the LPTR register 74 contains the address of the workspace for the last process currently waiting to be executed. In this way new processes can be added to the end of the list and the LPTR register 74 always indicates the current end of the list. The processor normally executes the processes on the list in sequence only advancing to a subsequent process when the current process executes a "pause" operation (code 9 in the operations list) or when the current process deschedules itself by executing a "join" operation (code 10 in the operation list) or a synchronise operation (code 11 in the operations list). In any of those situations, the current process ceases to carry out further instructions and the processor saves the instruction pointer IPTR in the process workspace as indicated at 36 in FIG. 2, and moves onto the next process which has been identified by the address of the next process, shown as 35 in FIG. 2 and then loads into the IPTR register 67 the IPTR for the new process. So that there is always at least one process running, a null process is provided and the null process is run when no other process is active.

The procedures "run", "wait", and "moveto" defined above are used in scheduling. A process will be "scheduled" when it is the current process or is on the linked list of processes which are waiting to be executed. A process becomes "descheduled" when it is taken off the linked list. A descheduled process will never be executed unless some other process or instruction schedules it, i.e. adds it to the end of the linked list. It will be recalled that LPTR register 74 (FIG. 3) is used to store the workspace pointer for the last process on the list. Hence, it must be adjusted whenever a process is added to the linked list. Also, when a process is to be scheduled, the CPU 12 must be able to determine which instruction is to be executed next for the process. This is done by storing in memory the appropriate instruction pointer IPTR, which is in IPTR register 67 while the process is current. Such storage is done, for example at memory location 36 (FIG. 2).

Figure 4:
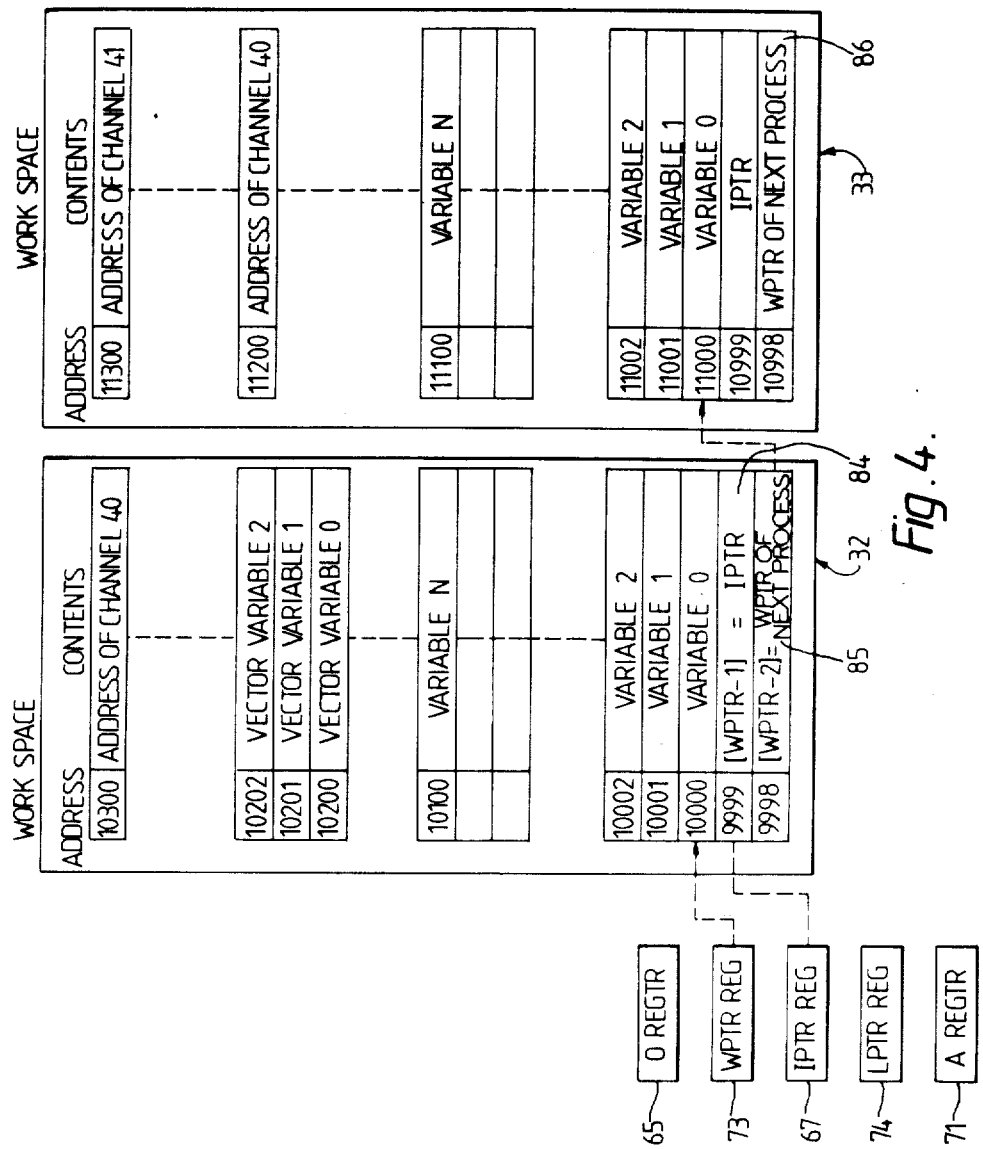
FIG. 4 illustrates the use of workspace within the memory.

In describing these procedures, it will be convenient to refer to FIG. 4 which illustrates workspaces 32 and 33 more particularly, as well as registers 65, 67, 71, 73 and 74. FIG. 4 shows representative memory addresses and contents of the workspaces.

The process which has the workspace 32 is made the current process by inserting its workspace pointer WPTR into register 73. In this case, WPTR equals 10000. When the process becomes the current process the processor finds the next instruction to be executed by examining WPTR-1, i.e. the contents at memory location 9999, to find a pointer 84 to an instruction and loads this pointer in the IPTR register 67. While this is the current process, the processor will use the contents of IPTR register 67 to point to the next instruction.

During the processing, it will use variables whose addresses are formed by combining a reference value, such as the WPTR or the contents of the A register 71, and an operand placed in register 65. In a load from workspace operation an operand of "2" will refer to whatever is at memory location 10002 while the process corresponding to workspace 32 is current. When processing is to stop, the linked list is consulted. Elements 85 and 86 are part of the linked list. The processor will look at WPTR-2 to find WPTR 85 at memory location 9998, pointing to the next workspace. Pointer 85 will contain the number 11000 which points to workspace 33. If the process corresponding to workspace 33 is the last process on the linked list, then LPTR register 74 will contain the pointer 11000. No pointer 86 will be stored at memory location 10998 until some process is added to the linked list.

Turning now to the three procedures, PROC run (w) is used to schedule a process defined by w i.e., add it to the linked list. This procedure has been defined above and reference will now be made to that definition and the line numbers used in the definition.

If the value of w is the special value "READY" no action is performed. Further explanation of this will follow later with reference to communications between different microcomputers. Otherwise w is a pointer to a process workspace, and lines 5 and 6 will be executed in sequence. In line 5, LPTR means the contents of LPTR register 74, which is a pointer to the reference address for the workspace for the last process on the linked list. The memory whose address is LPTR−2 would contain the address of the workspace pointer for the next process, but as yet there is none because LPTR corresponds to the last process. Line 5 now assigns w (the workspace pointer in the process w) to memory location LPTR−2, so process w is now at the end of the linked list. At this point, the contents of LPTR register 74 points not to the last process w, but to the penultimate process. This is corrected in line 6 which enters into LPTR register 74 the workspace pointer for process w. Because of this step, further processes can be added to the linked list without deleting process w unintentionally, which would happen if LPTR register 74 were not updated. With reference to FIG. 4, if there are only two processes scheduled, as shown, and process w corresponds to a workspace whose pointer is 12000, PROC run (w) would enter 12000 in memory [10998] and enter 12000 into register 74.

The procedure called "wait" can be used alone or in combination with PROC run (w). By itself, PROC wait deschedules the current process and enables the system to execute the next scheduled process, executing it where appropriate in its program instead of at its first instruction. In sequence with PROC run (w), PROC wait causes the microcomputer to stop the current process, schedule it at the end of the list of processes to be executed, and proceed to the next scheduled process. Reference will now be made to the previous definition of PROC wait. When procedure "wait" is called (line 1), a sequence is commenced (line 2) having four steps (lines 3, 4, 8 and 9). Lines 4–7 relate to external requests, and discussion of this can be deferred, although link [process] represents the contents of process register 47 of serial link 25 (FIG. 2). In line 3, memory [WPTR−1] is the memory space at the address WPTR−1, which is based on the reference address WPTR of the current process. That memory location is, in the preferred embodiment, used to point to the next instruction to be executed when the process is recommenced. The contents of IPTR register 67 always points to the instruction to be executed next for the current process. Hence, line 3 simply stores in memory (preferably on-chip) the pointer to the next instruction to be executed when, if ever, the process being descheduled becomes current. Assume that the current process is process w. If the procedure PROC run (w) has preceded PROC wait, then at this time, the current process (w) will have been added at the end of the linked list (by PROC run (w)), LPTR register 74 will have been updated (also by PROC run (w)), and now the pointer to the next instruction for process w will have been stored at a known location, memory [WPTR−1], with respect to the workspace pointer address (WPTR) for process w. Thus, process w is ready now to be deactivated. Line 8 of PROC wait looks to the linked list for the next process. Its workspace will be pointed to by the contents at address WPTR−2 of the current workspace w. Hence, line 8 of PROC wait assigns to WPTR register 73 the workspace pointer for the next process on the linked list. Now the reference address WPTR has advance, and the system next finds out what the next instruction is for this next process by looking at the pointer stored at the memory whose address is WPTR−1. To use FIG. 4, consider that workspace 32 is current and its process receives an instruction which includes PROC wait. Initially, WPTR is 10000. At line 8, register 73 is set to the contents found at memory address 9998, which will be the pointer 11000. At line 9, register 67 is set with the instruction pointer found at memory address 10999. Thus, if PROC run (w) is followed by PROC wait, the current process is added to the end of the list (its workspace pointer is stored on the linked list), the pointer to its next instruction is stored in memory, it is deactivated, and the next process on the linked list is commenced beginning at the proper instruction. All of this is done using only four registers. This arrangement permits the scheduling and descheduling of processes which are limited in number by only the amount of memory in the system.

The procedure named "moveto" can be used to set the workspace reference pointer to a different address in the workspace for the current process, without necessarily changing to a new IPTR. Thus, if a process has its reference workspace pointer at 10000, moveto (10200) could be used to set the registers to change the reference pointer to 10200 for this same process. This will be described as follows with reference to the previous definition of PROC moveto (w). Line 2 of the definition declares this is a sequence of steps. Lines 3 and 8 are equally offset from the left margin, so they both will be done in sequence. Assume that the system is not on the last process. Hence, line 4 will be false, so the system will jump to line 6. The condition at line 6 will be true, so line 7 will be executed. Line 7 sets the contents at memory address w−2 to the workspace pointer for the next process on the linked list. Next, line 8 changes the contents of the WPTR register 73 to the value w. Now register 73 points to a new reference address for the current process. At the customary offset (minus 2) from this new reference address will be found a pointer to the workspace for the next process to be scheduled. In the event that there is no next process, then line 4 will be true and LPTR register 74 will have its contents adjusted to point to w as the reference address for the last process (line 5), after which the register 73 for holding a pointer to the reference address of the current process will be adjusted to point to w.

Having now described FIG. 4 with reference to scheduling, some functions and operations will be further described with reference to FIG. 4.

load from workspace

The load from workspace function (function code 0) copies the contents at a specific memory location and puts it implicitly into the A register. This function and configuration of the preferred embodiment implicitly refers also to the memory whose address is defined by an offset from the current workspace pointer which serves as a reference. This reference address is always stored in the WPTR register 73, and the offset is contained in the operand register 65. The expression, "memory [WPTR+OREG]" therefore refers to the contents of the memory whose address is found by adding (summing) the contents of WPTR register 73 and register 65. A "load" refers to the A register 71, and the contents of the stack will be shifted down by one register, i.e. the contents of the A register will be shifted into the B register (to make room for the data to be loaded into AREG), and the contents of BREG will be loaded into the C register, if any. With reference to FIG. 4, if WPTR is 10000, then "load from workspace" using codes 0 2 will mean load variable 2 into the A register.

store to work space

This "store to workspace" function code 1 implicitly means move whatever is in the A register 71 into the memory space whose address is offset from the reference address (contained in WPTR register 73) by the offset contained in the operand register 65. Also, the stack moves up (BREG moves into AREG, and CREG moves into BREG). Referring to FIG. 4 if WPTR=10000 and OREG=1, then this function means store the contents of the A register 71 into memory location 10001, which is the location for storing variable 1.

load pointer into workspace

The function "load pointer into workspace" (function code 2) does not store any data into the workspace. Instead, it loads the A register 71 with a pointer to a particular location in workspace. This will be used, for example, in connection with the "load from vector" instruction which references a particular portion of a vector which can be stored in the workspace. Thus, referring to FIG. 4 a workspace 32 will be referred to by the workspace pointer WPTR which is 10000. At a known location within the workspace, there can be a vector. The vector will have a plurality of locations such as 10200, 10201 and 10202. The beginning of the vector will be a particular offset (200) away from the workspace pointer (10000). Thus, to find the beginning of the vector, the offset (200) will be loaded into the operand register 65 and then the instruction "load pointer into workspace" will add these two numbers to obtain a sum 10200 which is an address. This function will place the address 10200 into the A register, which points to the beginning of the vector. Thereafter, the "load from vector" operation will be used to find particular memory locations with respect to the beginning of the vector, and therefore it uses the offset in the operand register 65 but in combination with the A register 71 instead of the workspace pointer register 73.

load literal

The "load literal" function (function code 6) literally loads whatever is in the operand register 65 into the A register 71 (the top of the evaluation stack). With respect to FIG. 5, the last four bits of any given instruction will be loaded into the operand register 65, but by use of the prefixing functions, more than 4 bits can be stored in the operand register. Illustratively, however, an instruction having the codes in decimal notation of 6 13 has two parts, a function part and a data part, as explained referring to FIG. 5. The first number "6" is the function code, indicating that this is a "load literal" function. The second part of the instruction is the data value "13". Accordingly this instruction "6 13" would mean load the number 13 into the A register 71 and shift the previous contents of the A register into the B register 72.

jump

The "jump" function (function code 8) is used for branching in a program. The instruction to be executed next by the processor for the current process is pointed to by the contents of the IPTR register 67 which contains the instruction pointer. The jump instruction adds the contents of the operand register 65 to the instruction pointer. Through use of the prefixing functions, the instruction pointer can have values added to it or subtracted from it, to jump forward or backward in a program.

call procedure

The "call procedure" function (function code 11) uses the "moveto" procedure which was described above. "Call procedure" first stores IPTR in memory at the customary location for the instruction next to be executed (e.g. memory location 9999 in FIG. 4). Next it transfers into the instruction pointer register 67 the contents of the A register 71 which will have been loaded with the pointer to an instruction next to be executed after the "call procedure" function is completed. Then the A register 71 is loaded with the workspace pointer. Following this, the "moveto" procedute changes the reference pointer WPTR so that usually it points to a different address in the current workspace. It will be remembered that "moveto ( )" procedure will set the contents of the WPTR register 73 to whatever is within the parenthesis following the word "moveto". Thus, after a "call procedure," the system now has the workspace pointer pointing to a different location within the same workspace for the current process and is prepared to execute a different instruction which was previously contained in the A register 71. The converse operation is effected by use of the RETURN operation operation (operation code 12).

run process

This operation "run process" (operation code 8) is generally used in the creation of a process which will have its own workspace and set of instructions. The A register 71 will have been loaded with a workspace pointer for the workspace for the new process, and the B register 72 will have been loaded with a suitable instruction pointer for the new process. Operation "run process" stores the instruction pointer in memory at the proper offset from the workspace pointer, and then it calls the procedure PROC run ( ), discussed above, using the workspace pointer in the parentheses. As discussed, this will schedule the new process, i.e.. it will add the new process to the linked list.

pause

The "pause" operation (operation code 9) appears in a program to prevent any single process from using the ALU 55 to the exclusion of other processes. This operation is inserted into loops by the compiler. This operation adds the current process to the end of the linked list, stores the necessary pointers, causes the current process to cease execution for the time being, and makes the next process on the linked list the current process. The contents of the evaluation stack are *not* preserved because "pause" is executed at a time when such contents can be discarded without harming the process.

join

This "join" operation (operation code 10) is used for example when there are concurrent processes, and it is intended that they should all be at a point in the program at the same time. Consider an original process P(0) which at a certain point in the program spreads into n concurrent subprocesses P(1), P(2), P(3) . . . P(n). When these are done, a final process P(n+1) is to execute. However, such final process should not occur until all of P(1) . . . P(n) have terminated. The "join" operation is used for this. A counter is set up in the workspace, and the A register 71 points to the memory location where the count is stored. The count corresponds to the number of subprocesses (which are still active (not terminated). Each subprocess ends with a "join" operation. After a subprocess reaches its "join" operation, it checks the count. If the count is zero, then the program moves to the final process using the "moveto" procedure. If the count is not zero, the count is decremented by one count, and then the subprocess is caused to "wait" as described above. The other subprocesses are executed until zero count is reached.

synchronise

The "synchronise" operation (operation code 11) is quite important to concurrent processing, for its use assures that two processes will be at the same point at some time. This will be discussed further in connection with FIG. 9 and the discussion entitled, "Communication Between Processes On The Same Microcomputer." Briefly however, if two processes X and Y on the same chip wish to communicate, presumably because one process is computing data which the other process needs, a channel 40, 41, 42 or 43 (FIG. 2) is used. Each process will have a "synchronise" operation. The first process to reach its "sync" operation will look at the channel. The channel address will have been loaded into the A register 71, so "memory [AREG]" refers to the channel. The expression "NIL" in the definition of this operation refers to a predetermined datum recognised as a nil. If NIL is found in a first part of the channel by the first process to reach its sync operation, such process will place its workspace pointer into the first part of the channel and then will deschedule itself. Assume that it is process X which first reaches "sync". Process X now waits for process Y to reach its "sync" operation. When this happens, process Y will check the first part of the same channel, and it will not find NIL but will instead find the workspace pointer for process X. In response, it schedules process X (adds it to the end of the linked list). The first part of the channel returns to NIL. Generally there will be at least a second part to the channel where data for transfer from one process to the other will be placed. Also, synchronise operations generally occur in pairs. The first "sync" operations in two processes can cause the process to wait for data and then transfer it when it is ready. The second "sync" instructions cause acknowledgments. Thus, a process which is inputting data from a process will "sync". If the data is not ready, it will "wait". When the data is ready by the supply process, that supplying process will schedule the receiving process, which will then take the data. Then "sync" instructions by each acknowledge the transfer. The first "sync" by the process supplying the data will indicate that the data is ready to be taken.

COMMUNICATION BETWEEN PROCESSES ON THE SAME MICROCOMPUTER

As already explained, the microcomputer permits communication between processes which may be on the same microcomputer or on different microcomputers. For example, one process may be the measurement of distance travelled by a motor car and a second process the measurement of consumption of fuel relative to distance travelled for that vehicle. The first process may receive as an input, data representating rotations of the vehicle wheel and provide an output representing miles travelled. The second process may receive as an input data relating to fuel quantity consumed but it also needs to communicate with the first process to derive information about distance travelled before it can provide a useful output regarding fuel consumption relative to distance. In the case of process to process communications on the same microcomputer communication is carried out in this example through the channels 40 to 43 indicated on FIG. 2. This operation involves the use of the synchronise operation, this requires a program instruction consisting of function code 13 and operation code 11 from the above list of functions and operations. Each channel 40 to 43 consists of two consecutive word locations in memory, one providing a "process location" and the other a "data location". The channel is a unidirectional communication channel which is shared by two and only two processes at any one time. When an active process x wishes to communicate with a process y on the same microcomputer, it follows a sequence which will be described with reference to FIGS. 9a to 9e. Firstly, process x identifies the address of the channel (marked 40) and loads the data it wishes to communicate into the data location of the channel. It also executes an instruction for a synchronise operation. Provided the process location of channel 40 does not already have the workspace pointer of the process y awaiting to receive the data, the synchronise operation causes the work space pointer of process x to be recorded in the process location of channel 40 and uses a "wait" procedure to deschedule process x. This is the position shown in FIG. 9b. In FIG. 9, the work space pointer of process X is referred to as "X" and the data being communicated is referred to as "DATA." Process x now waits until process y is ready to receive the data. When process y wishes to receive the data it carries out an instruction for a synchronise operation to see if the communication channel 40 is ready to transmit data. In carrying out this instruction, process y locates the workspace pointer "X" of process x in the process location of channel 40 and as can be seen from the synchronise operation set out in the list of operations, the execution of a synchronise operation causes a "run" procedure to remove the workspace pointer of process x from channel 40 and add process x to the end of the list of processes waiting to be executed. This is the position in FIG. 9c. Process y then reads the data from the data location of channel 40 and then operates a further instruction for a synchronise operation to indicate that it has received the data. This loads the workspace pointer "Y" of process y into the process location of channel 40 and causes process y to wait. This deschedules process y leaving the channel 40 in the condition shown in FIG. 9d. Once the list on which process x is waiting reaches process x so that process x is reactivated, it performs a further instruction for a synchronise operation which now locates the workspace pointer "Y" of process y in the process location of channel 40 and this allows process x to continue to be operated. At the same time it causes a "run" procedure on process y so that process y is again added to the end of the waiting list of processes and is ready to run. The communication channel 40 is then in the condition shown in FIG. 9e with process x continuing and process y waiting on the list. In this way, synchronisation of communication is achieved by both processes operating a "handshake" operation in which both processes execute two instructions for synchronise operations one of which deschedules the process and that descheduled process is only put back onto the list when an appropriate signal has been received from the other of the communicating processes.

Figure 10:
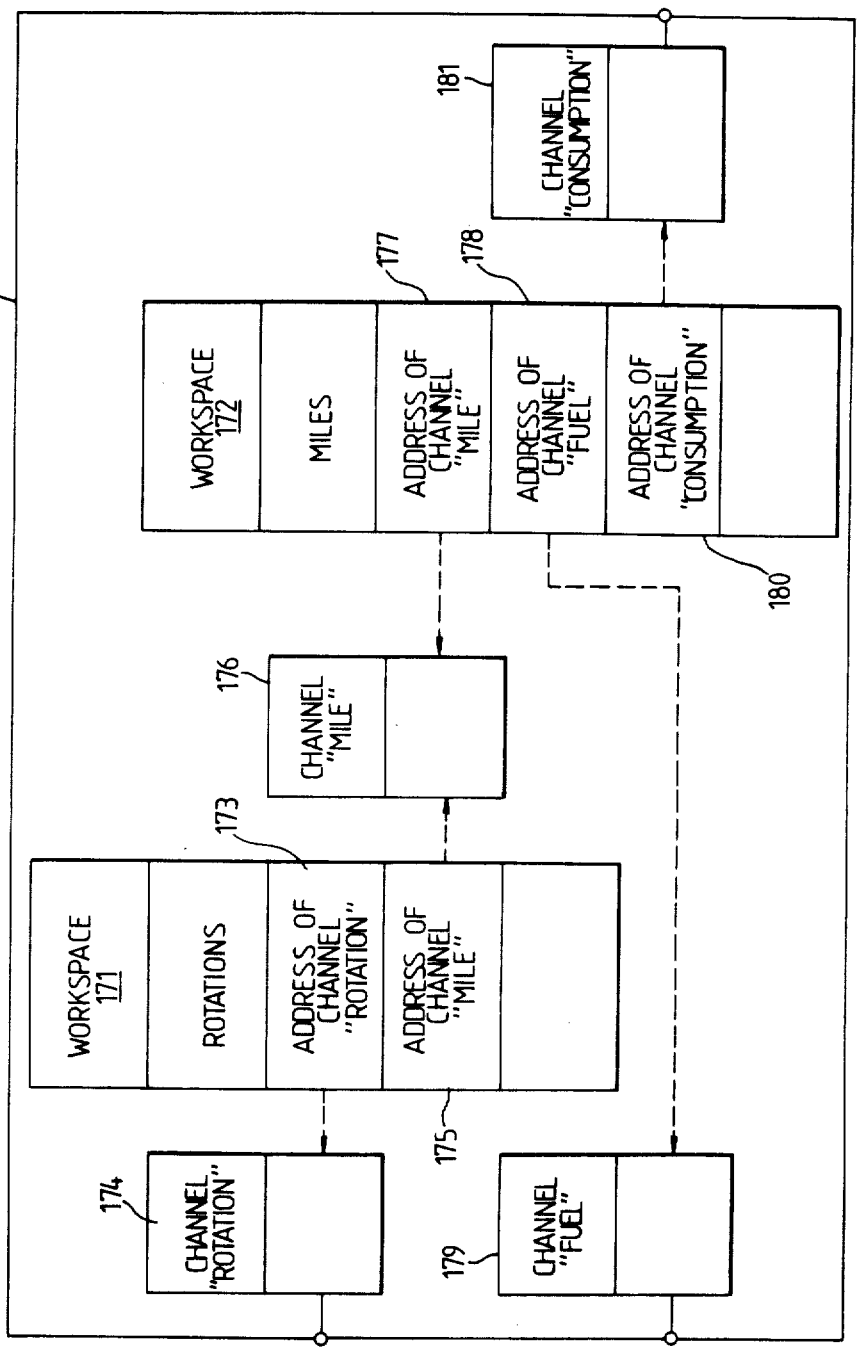
FIG. 10 illustrates the operation of two communicating processes on one microcomputer.

A specific example of programs and instruction sequences necessary to carry out two communicating processes on the same microcomputer will now be described with reference to FIG. 10. This illustrates the two processes referred to above for measuring miles travelled and fuel consumption of a motor vehicle. The microcomputer 170 has in its memory space a first workspace 171 for the first process which is counting the variable "rotations" and a second workspace 172 for the second process which is counting the variable "miles". Workspace 171 has a word location 173 containing the address of the input channel 174 called "rotation" which forms part of a serial link arranged to receive a message for each wheel revolution from an external revolution detector (not shown). The workspace 171 has a further word location 175 containing the address of a two word memory channel 176 called channel "mile" which in this case receives an output from the process of workspace 171 indicating 1 mile of travel for each 1000 revolutions of the vehicle wheel.

For this first process the program using OCCAM language is as follows:

```
1.       VAR rotations:
2.       WHILE TRUE
3.         SEQ
4.           rotations: = 0
5.           WHILE rotations < 1000
6.             SEQ
7.               rotation ? ANY
8.               rotations: = rotations + 1
9.           mile ! ANY
```

Line numbers are not part of the program but have been added to facilitate explanation. Line 1 declares a variable to exist; it is called "rotations". Line 2 is an endless loop because the condition TRUE is always true. Start with zero rotations (line 4). Line 7 waits for any input from the channel named "rotation." When one is received, the variable "rotations" is incremented by one. Eventually there will have been 1000 rotations, and Line 5 will be false. Lines 6, 7 and 8 will then be skipped and Line 9 will output a datum to the channel named "mile".

The compiler will convert these OCCAM statements to the following machine instructions:

the workspace is 0. In lines 6, 7 and 8 the decimal value 1000 is to be added. This requires a prefixing opration because 1000 cannot be represented using four binary bits in the data portion of the instruction. Thus, function code 14 (pfix) is used. The decimal number 1000 in binary is 1111101000. Because this requires ten bits, and the data portion of standard instructions is four bits, three steps are required to load this value into the operand register. Line 8 includes the code for the "load literal" function, so at this time, the A register 71 will be loaded with the binary value of 1000. This causes the transfer of the contents of the A register (which are 0) to the B register 72.

Line 9 calls for an indirect function, the operation "greater than". This causes a comparison of the A and B registers. Unless the B register contents are greater than the A register contents, this operation will result in FALSE (0).

Line 10 is the "jump nonzero" operation. If the results of line 9's operation were true, then the A register would be set to a nonzero value, and line 10 would cause a jump of 9 lines forward, indicated by the number "9" in the data part of the code. This should jump

| Instruction Sequence | | | Function code | Data | Program in OCCAM Language |
|---|---|---|---|---|---|
| | | | | | VAR rotations: |
| | | | | | WHILE TRUE |
| | | | | | SEQ |
| 1. | L1: | | | | |
| 2. | | ldl | 0 | 6 | 0 |
| 3. | | stw | 0 | 1 | 0 | rotations := 0 |
| 4. | L2: | | | | |
| | | | | | WHILE rotations <1000 |
| | | | | | SEQ |
| 5. | | ldw | 0 | 0 | 0 |
| 6. | | pfix | | 14 | 3 |
| 7. | | pfix | | 14 | 14 |
| 8. | | ldl | 1000 | 6 | 8 |
| 9. | | opr | gt | 13 | 2 |
| 10. | | jnz | L3 | 9 | 9 |
| 11. | | ldw | 1 | 0 | 1 | rotation ? ANY |
| 12. | | opr | sync | 13 | 11 |
| 13. | | ldw | 1 | 0 | 1 |
| 14. | | opr | sync | 13 | 11 |
| 15. | | ldw | 0 | 0 | 0 | rotations:=rotations+1 |
| 16. | | adl | 1 | 7 | 1 |
| 17. | | stw | 0 | 1 | 0 |
| 18. | | opr | pause | 13 | 9 |
| 19. | | nfix | | 15 | 0 |
| 20. | | j | L2 | 8 | 0 |
| 21. | L3: | | | | |
| 22. | | ldw | 2 | 0 | 2 | mile ! ANY |
| 23. | | opr | sync | 13 | 11 |
| 24. | | ldw | 2 | 0 | 2 |
| 25. | | opr | sync | 13 | 11 |
| 26. | | opr | pause | 13 | 9 |
| 27. | | nfix | | 15 | 2 |
| 28. | | j | L1 | 8 | 7 |

Once again, line numbers have been added for explanatory purposes only. Lines 1, 4 and 21 are simply reference locations in the program. Line 2 loads the value 0 into A register 71. Line 3 stores the data in the A register into workspace. Because the data part of the instruction is 0, there is no offset from the reference address for this process. Thus, the workspace pointer register 73 now contains a workspace pointer WPTR which points to a reference address in memory where 0 is stored for the variable "rotations". Line 5 loads the A register 71 from workspace. Because the data portion of the instruction (which would be loaded into operand register 65) is 0, the offset from the reference address WPTR of the program ahead to line 21, the output portion. Assuming that 1000 rotations have not yet been counted, line 11 is next executed. This load from workspace function has an operand of +1, which means the offset from the reference address is +1. At this memory address will be found the address of the channel named "rotation" and this address will be loaded from the workspace into the A register 71. Line 12 causes a synchronise operation. Line 13 again loads the address of the channel "rotation" and line 14 again synchronises to complete the input operation. In this simple example, no data is transferred. Line 15 now loads the variable which is in workspace, offset 0, into the A register, i.e.

loads the current value of "rotations" into the A register. Line 16 literally adds the data value 1 to the contents of the A register. Line 17 stores the contents of the A register in the workspace at an offset equal to 0. Hence, the variable "rotations" has now been incremented in response to receipt of data from the channel "rotation". Line 18 is a pause operation which allows the next process to be executed, adding this present process to the end of the list. Note that at this point in the program, the contents of the A register 71 and B register 72 are not relevant to the process. Lines 19 and 20 execute a jump backwards using the negative prefix function. Line 22 loads the contents of the workspace which is offset 2 locations from the reference location. This will be the address of the channel named "mile" and it will be loaded into the A register. A sync operation is performed at line 23. The output is completed by a further "sync" which occurs at line 25. At line 26 another pause is inserted to cause the next process to schedule and to add this process to the end of the linked list. At lines 27 and 28, a jump backwards is executed using negative prefixing. The second process relating to the variable "miles" uses the workspace 172. The workspace 172 has a word location 177 containing the address for the "mile" channel 176 which is used to provide an input to the process of workspace 172. A further word location 178 has the address of a second input which in this case is a channel 179 called channel "fuel" forming part of a serial link arranged to receive a message from an external fuel gauge (not shown) each time a gallon of fuel is consumed. The workspace 172 has a further word location 180 having the address of an output channel 181 called channel "consumption" forming part of a serial link arranged to output the distance travelled while the last gallon of fuel was consumed. Clearly the process in workspace 172 needs to communicate with the process in workspace 171 in order to obtain via channel 176 messages indicating the number of miles travelled. The instruction sequence and program for the process in workspace 172 are as follows:

| Instruction sequence | | Function code | data | Program in above defined OCCAM |
|---|---|---|---|---|
| | | | | VAR miles: |
| | | | | SEQ |
| L1: | | | | |
| | ldl | 0 | 6 | 0 | miles := 0 |
| | stw | 0 | 1 | 0 | WHILE TRUE |
| L2: | | | | | ALT |
| | ldw | 1 | 0 | 1 | mile ? ANY |
| | ldv | 0 | 4 | 0 | |
| | opr | eqz | 13 | 1 | |
| | jnz | 13 | 9 | 9 | |
| | ldw | 1 | 0 | 1 | |
| | opr | sync | 13 | 11 | |
| | ldw | 1 | 0 | 1 | |
| | opr | sync | 13 | 11 | |
| | ldw | 0 | 0 | 0 | |
| | | | | | miles := |
| | | | | | miles + 1 |
| | adl | 1 | 7 | 1 | |
| | stw | 0 | 1 | 0 | |
| | pfix | | 14 | 1 | |
| | j | L4 | 8 | 0 | |
| L3: | | | | | |
| | ldw | 2 | 0 | 2 | fuel ? ANY |
| | ldv | 0 | 4 | 0 | |
| | opr | eqz | 13 | 1 | |
| | jnz | L4 | 9 | 12 | |
| | ldw | 2 | 0 | 2 | |
| | opr | sync | 13 | 11 | |
| | ldw | 2 | 0 | 2 | |

| Instruction sequence | | Function code | data | Program in above defined OCCAM |
|---|---|---|---|---|
| | opr | sync | 13 | 11 | |
| | | | | | SEQ |
| | ldw | 3 | 0 | 3 | consumption ! |
| | | | | | miles |
| | ldw | 0 | 0 | 0 | |
| | stv | 1 | 5 | 1 | |
| | opr | sync | 13 | 11 | |
| | ldw | 3 | 0 | 3 | |
| | opr | sync | 13 | 11 | |
| | ldl | 0 | 6 | 0 | miles := 0 |
| | stw | 0 | 1 | 0 | |
| L4: | | | | | |
| | opr | pause | 13 | 9 | |
| | nfix | | 15 | 1 | |
| | j | L2 | 8 | 0 | |

COMMUNICATION BETWEEN PROCESSES ON DIFFERENT MICROCOMPUTERS

Figure 11:
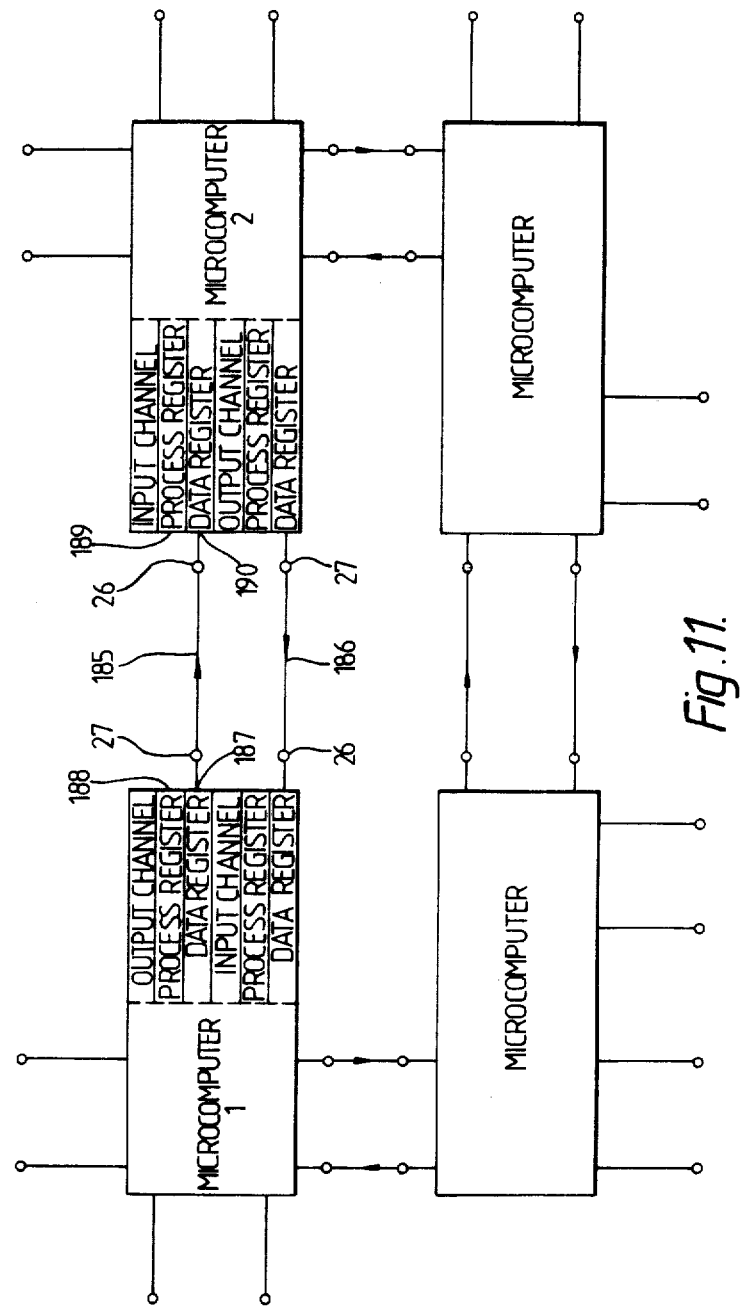
FIG. 11 shows a network of interconnected microcomputers, including detail of the serial link connection between two of them.

A network of interconnected microcomputers is shown in FIG. 11 in which four microcomputers are illustrated. It will be understood that the network may be extended in two or three dimensions as required. Each of the microcomputers is of similar structure and is interconnected with the serial link of another microcomputer by two unidirectional wires 185 and 186 each of which extends between the output pin 27 on one microcomputer and the input pin 26 of another microcomputer. The wires 185 and 186 are each used solely for these two pin to pin connections and are not shared by other microcomputers or memory connections. Communication between processes in different microcomputers is effected in generally similar manner using an identical sequence of synchronise operations and this will be described with reference to FIGS. 2, 11, 12 and 13. In place of the channel 40 (FIG. 2), a serial link has an input channel 45 and an output channel 46 each consisting of a process register 47 and data register 48 which can be addressed in the same way as the word locations for the memory channels 40 to 43. They are however operated by control logic 50 which will be described further with reference to FIGS. 15 and 16. In FIG. 11, an output channel is shown with a data register 187 and a process register 188. An input channel is shown having a process register 189 and a data register 190. The control logic shown in FIG. 2 is not shown in FIG. 11, but it will be understood that such logic is present.

When data is transmitted through serial links between two microcomputers, it is in the form of a series of data strings transmitted serially in the form of packets as shown in FIGS. 13a and 13b. A data packet is transmitted by an output pin 27 to an input pin 26 and has the form shown in FIG. 13a. It starts with two successive bits of value 1 followed by 16 data bits and a final stop bit of value 0. An acknowledge packet, as shown in FIG. 13b is sent from the output pin 27 of a microcomputer receiving a data packet to the input pin 26 of the microcomputer which sent the data packet. The acknowledge packet consists of a start bit of value one followed by a stop bit of value 0. The output control logic of each serial link arranges for each output pin 27 to transmit bits of value 0 continuously when it is not sending data or acknowledge packets and consequently the input control logic ignores all signals on the input pins 26 until it receives a "1" start bit of a packet.

When the process register 47 (FIG. 2) of the input or output channel 45, 46 holds the workspace pointer (WPTR) of a process, the control logic 50 is able to generate requests (called input or output requests) to the CPU (12) for the CPU 12 to schedule the process by adding its workspace pointer to the list awaiting execution. The sync logic 10 provides a selector which is used by the CPU 12 to examine each of the request signals from the serial links in turn. Whenever an active process is descheduled by execution of the "wait" procedure, the CPU 12 looks to see if there are any requests from a serial link. If there are several external requests, the CPU 12 services all of them in sequence before executing the next process on the list. The CPU 12 services any requests by scheduling the process held in the process register of the channel which generated the request, and resetting the process register 47 to NIL. The process register 47 of the input or output channels in a link 25 contains the special value READY when that channel is ready to perform communication. The sync operation will cause the procedure "run" which detects the special value READY and instead of scheduling a process, activates the control logic 50 in the link. The control logic in a link may perform a synchronise operation on a channel. The synchronise operation tests the process location of the channel. If the value is NIL, it replaces the value with the special value READY and waits until a sync operation caused by a process instruction on the process register resets the value to NIL. Otherwise, it generates a request to the CPU 12 to schedule the process in the process register as described above, and the CPU then resets the value of the process register to NIL. As a result, a process may use the sync operation to synchronise with the control logic 50 in a link 25 in the same way as it is used to synchronise with another process.

The output control logic 50 in a link 25 first synchronises with a process using the process register in the output channel, then transmits data in data packets from the data register in the output channel via the output pin 27 (FIGS. 2 and 11), then waits for an acknowledge packet signal on the input pin 26, then synchronises with the process again using the process register in the output channel. The output control logic 50 performs this operation repeatedly. The input control logic in a link first waits for data from the input pin 26 to arrive in the data register in the input channel, then synchronises with a process using the process regiser in the input channel, then synchronises again with the process using the process register in the input channel, then transmits the acknowledge packet signal to the output pin 27. The input control logic performs this operation repeatedly.

In the following, it is assumed that a process x operated by microcomputer 1 in FIG. 11 wishes to output data through a serial link to a process y operated by microcomputer 2. To effect this output, the process x stores the data to be output in the data register 187 of the output channel and executes a sync operation on the process register 188 to cause the serial link to start transmission of the data through the pin 27. The process then executes a further sync operation on the same process register 188 to wait until an acknowledge packet is received through the input pin 26 of microcomputer 1. The acknowledge packet signifies that the process y operated by microcomputer 2 has input the data. To input, the process y executes a sync operation on the process register 189 of the input channel of microcomputer 2 to wait for the data packet to arrive from the pin 26 of the microcomputer 2. It then takes the data from the data register 190 and executes a further sync operation to cause the acknowledge signal to be transmitted from the output pin 27 of microcomputer 2.

Figure 12:
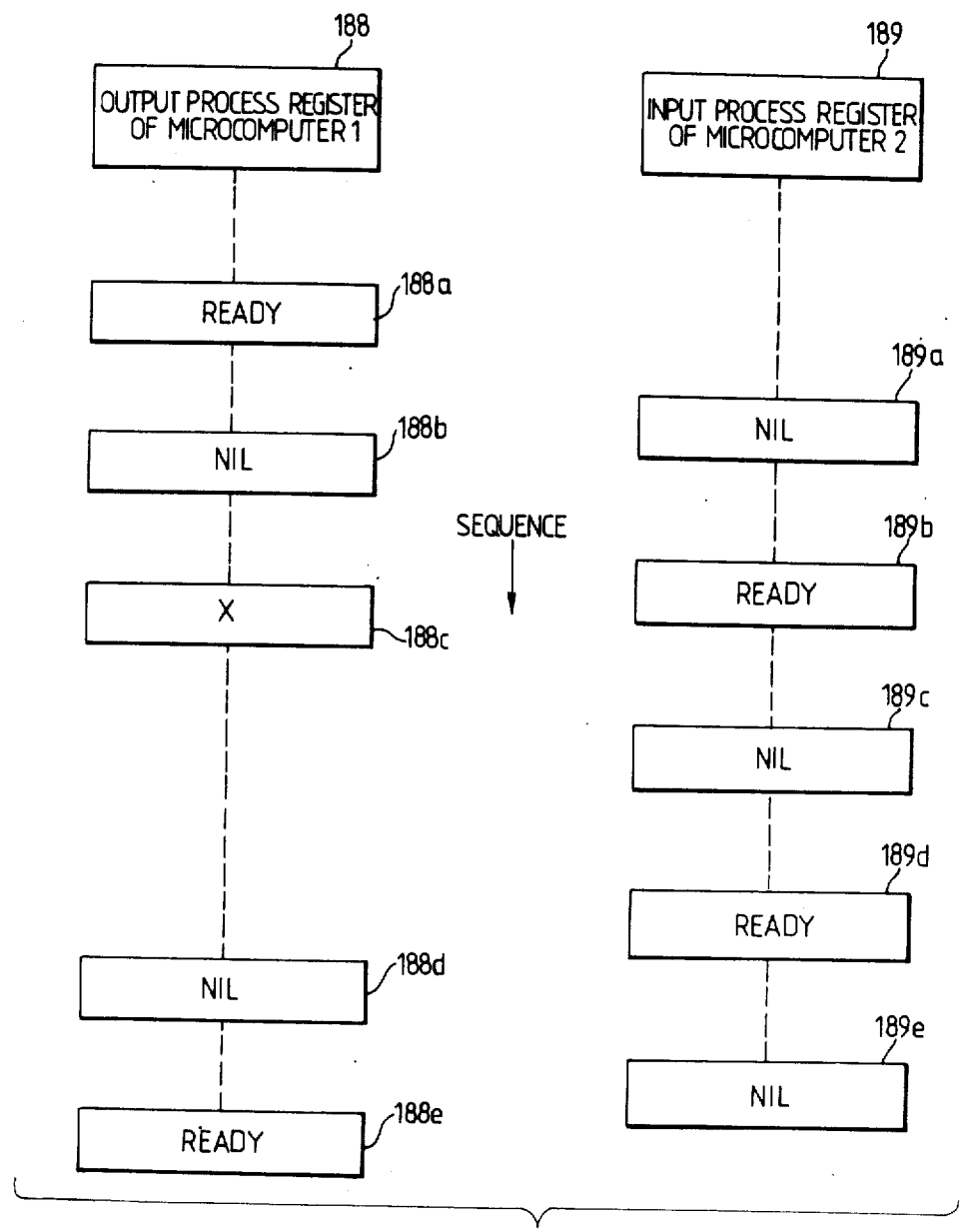
FIG. 12 illustrates a sequence of operations for effecting communication via serial links between two processes carried out on different microcomputers.

FIG. 12 shows sequentially the contents of the process registers 188 and 189 during a typical sequence of operations occurring when the processes x and y communicate via the serial link. Reference numerals 188a-e represent successive states of the contents of the process register 188 and reference numerals 189a-e similarly represent successive states of the contents of the process register 189. First, process x addresses the output channel of microcomputer 1 and loads the data to be output to the data register 187 and performs a sync operation on the output process register 188. Assuming that the process register 188 contains the special value READY 188a, indicating that the serial link is ready to output, the sync operation resets the value of the process register 188 to NIL 188b. As a result the control logic causes the data from the data register 187 to be transmitted via the single wire connection 185 to the input data register 190 in the microcomputer 2. Provided that process y is not yet waiting for the input, the control logic in microcomputer 2 changes the value of the process register 189 from NIL 189a to READY 189b, indicating that the data has been received. Process y then executes a sync operation on the process register 189, which has the effect of changing the value of the process register from READY 189b to NIL 189c. Assuming that microcomputer 2 is ready to transmit an acknowledge signal to microcomputer 1, the control logic changes the value of process register 189 back to READY 189d. Process y then takes the data from the data register 190 of the input channel and executes a further sync operation on the process register 189. This resets the process register 189 to NIL 189e. As a result the control logic transmits an acknowledge signal through the single wire connection 186. This acknowledge signal is received by the input pin 26 of the microcomputer 1 operating process x. Assuming that process x executes a second sync operation before the acknowledge signal is received, process x is descheduled by the procedure "wait", and its workspace pointer "X" is stored in the process register 188(188c). When the acknowledge packet is received the control logic of the serial link generates a request to the CPU of microcomputer 1 to schedule process x. This request is serviced by the CPU of microcomputer 1 as soon as the current process is descheduled and the CPU adds process x to the end of the list and resets the process register to NIL (188d). The control logic now resets the process register to READY (188e), thereby indicating that the link is ready for a further output. The state of the serial links is now the same as it was before the communication took place, as shown in the sequence of FIG. 12, ready for the next communication.

Figure 14:
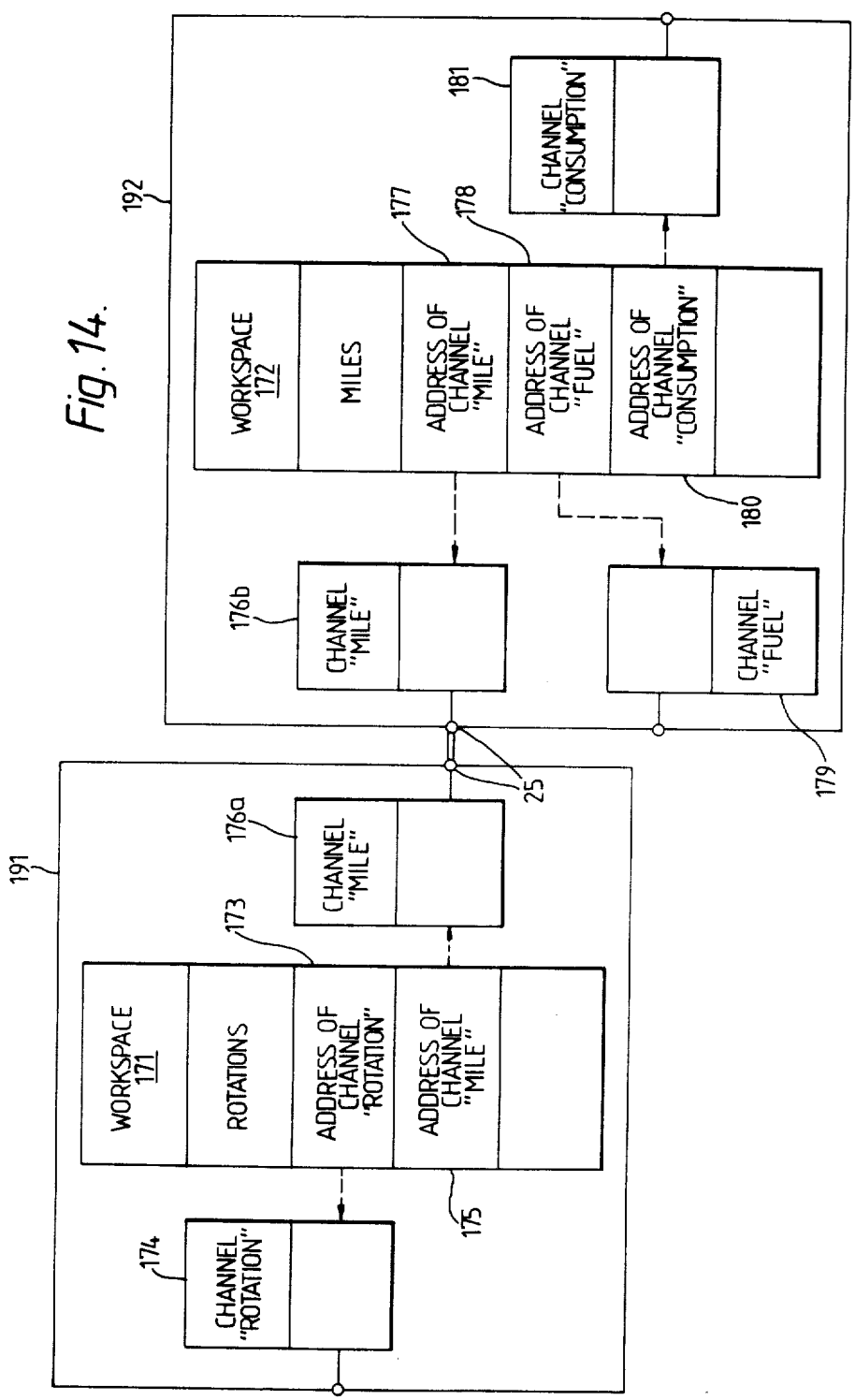
FIG. 14 illustrates the operation of the same two communicating processes of FIG. 10 on two interconnected microcomputers.

FIG. 14 illustrates the operation on two separate microcomputers of the processes previously described with reference to FIG. 11. In this case however the workspace 171 for counting rotations is on a microcomputer 191 whereas the workspace 172 for counting miles is on a separate microcomputer 192. The two microcomputers 191 and 192 are interconnected through respective serial links 25. Similar reference numerals are used in FIGS. 14 and 10 for similar parts. The only change is that channel "mile" 176 in FIG. 10 is replaced in FIG. 14 by a channel "mile" 176a forming an output channel of a serial link in microcomputer 191 and channel "mile" 176b forming an input channel of a serial link in microcomputer 192. The sequence of instructions and program used to operate the two processes in FIG. 14 are generally similar to those already described for FIG. 10 except that the address of channel "mile" used by each of the processes will now be the address of a channel of a serial link rather than a channel in memory.

DESCRIPTION OF LINK CONTROL LOGIC

Figure 15:
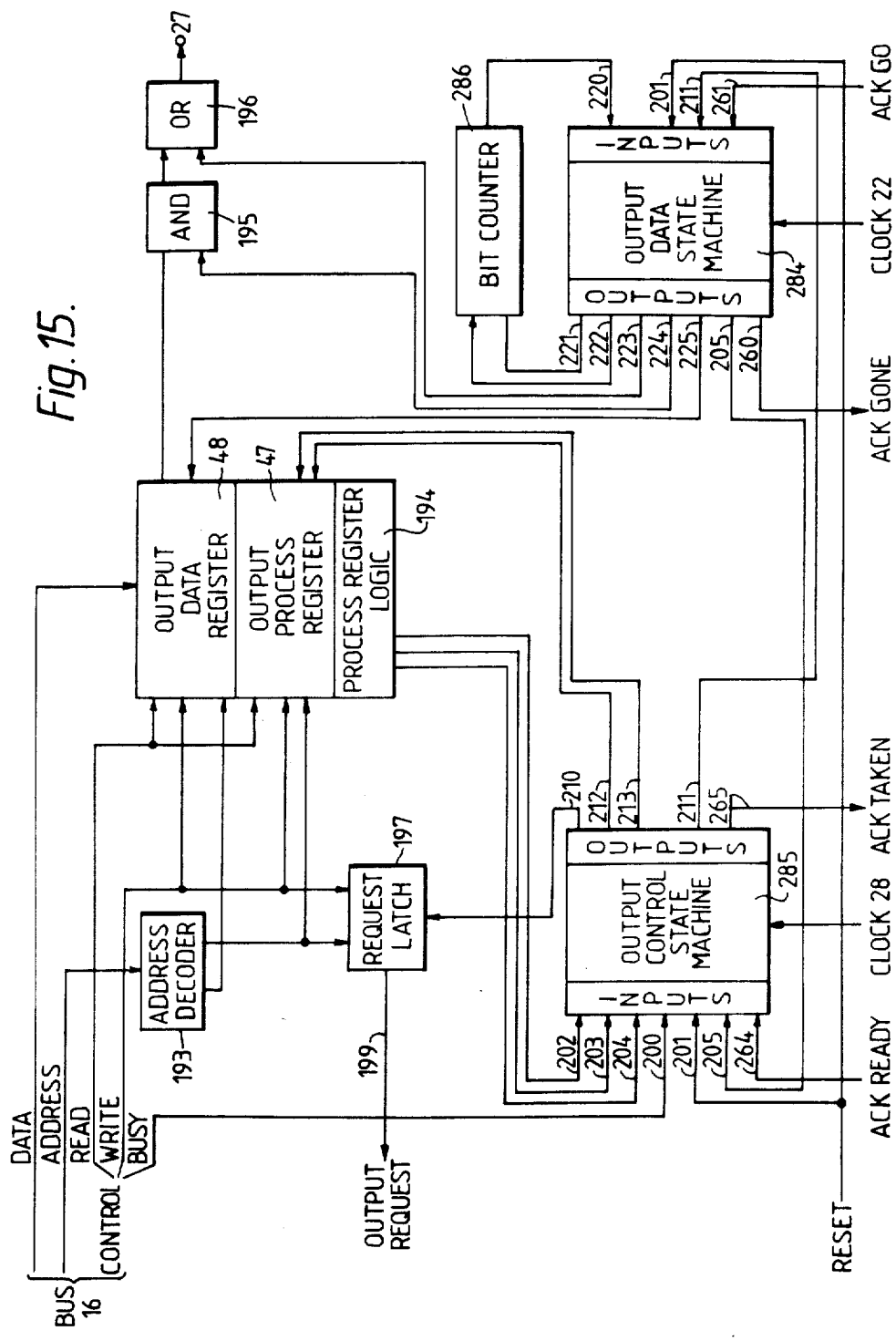
FIG. 15 shows a logic diagram of one output serial link.
Figure 16:
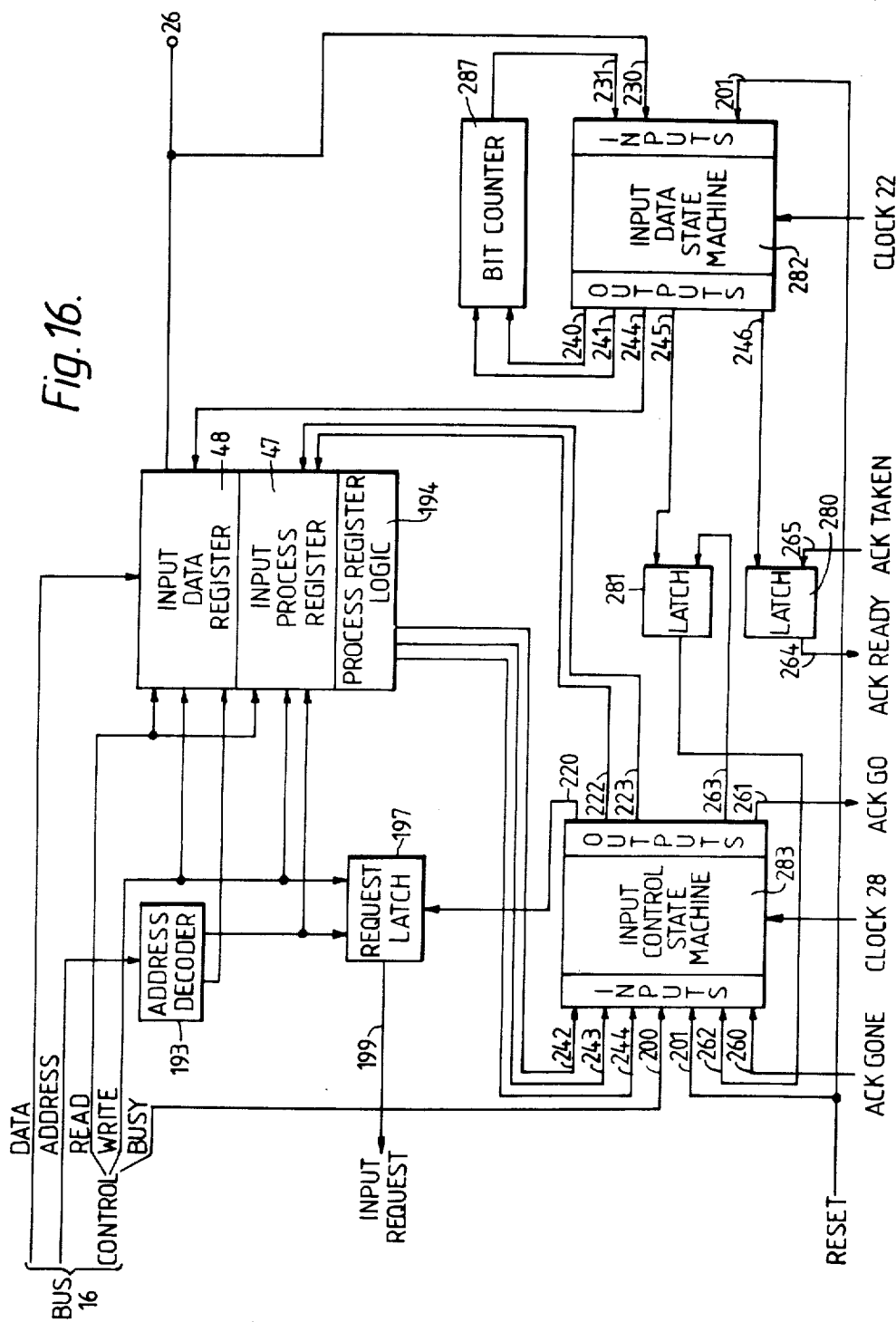
FIG. 16 shows a logic diagram of one input serial link.

The control logic 50 (FIG. 2) for each of the input and output channels of the serial links will now be described in further detail with reference to FIGS. 15 and 16 in which FIG. 15 shows the control logic for the output channel 46 and FIG. 16 shows the control logic for the input channel 45.

To output, the control logic 50 (FIG. 2) of a link first synchronises with a process using the output process register 47 (FIG. 15), then transmits the data from the output data register 48 to the pin 27, then waits for the acknowledge signal from the pin 26, then synchronises with a process again using the output process register 47. The control logic 50 performs this operation repeatedly.

To input, the control logic 50 (FIG. 2) of a link first waits for data to arrive from the input pin 26 and transfers it to the input data register 48, then synchronises with a process using the input process register 47 (FIG. 16), then synchronises again with the process using the input process register, then transmits the acknowledge signal to the pin 27. The control logic 50 performs this operation repeatedly.

The values taken by the output and input process registers 47 may be NIL indicating that neither a process nor the control logic is waiting to synchronise, READY indicating that the control logic is waiting to synchronise, or it may be the workspace pointer of a process waiting to synchronise.

In a link, each process register 47 and each data register 48 is connected to the bus 16 through an address decoder 193. The bus 16 incorporates signal lines for the address, data, and control. Control includes a "write" signal, a "read" signal and a "busy" signal. The "busy" signal is used to ensure that both the CPU and the link control logic do not attempt to change the value of the process register simultaneously.

Each process register 47 in a link incorporates logic 194 to detect if the value in the process register is READY, NIL or a workspace pointer.

The output data register 48 (FIG. 15) is connected to the output pin 27 through an AND gate 195 and an OR gate 196. The input data register 48 (FIG. 16) is connected directly to the input pin 26.

Associated with each process register in a link is a request latch 197 which may be tested by the CPU. Whenever the CPU performs a WAIT procedure, the state of all request latches is tested. If a request latch is set, the process whose workspace pointer is held in the corresponding process register is scheduled by adding its workspace pointer to the end of the list. The request latch is cleared whenever the CPU writes to the process register.

The input and output of data through the link is controlled by four state machines 282, 283, 284 and 285. Each state machine consists of a state register to hold the current state, and a programmable logic array. The programmable logic array responds to the value of the state register and the input signals to the state machine, and produces a predetermined pattern of output signals and a new value for the state register. A counter 286 is used to count bits as they are transmitted through the link, and a further counter 287 is used to count bits as they are received through the link.

The input and output channel control and data state machines have the following inputs and outputs, wherein the name of the input or output indicates the purpose of the signal.

| reference numeral | signal name | purpose |
|---|---|---|
| (FIG. 15) OUTPUT CONTROL STATE MACHINE 285 | | |
| inputs: | | |
| 200 | Mbusy | Memory bus busy |
| 201 | Reset | Transputer reset |
| 202 | Pregready | Process Register = READY |
| 203 | Pregnil | Process Register = NIL |
| 204 | Pregwptr | Process Register holds a workspace pointer |
| 205 | Datagone | Data transmitted from output data register |
| 264 | Ackready | Acknowledge received by input state machine |
| outputs: | | |
| 210 | Setrequest | Set cpu request |
| 211 | Datago | Initiate data transmission |
| 212 | SetPregready | Set Process Register to READY |
| 213 | SetPregnil | Set Process Register to NIL |
| 265 | Acktaken | Confirm receipt of acknowledge |
| OUTPUT DATA STATE MACHINE 284 | | |
| inputs: | | |
| 201 | Reset | Transputer reset |
| 211 | Datago | Initiate data transmission |
| 220 | Countzero | Test if bit count zero |
| 261 | Ackgo | Initiate acknowledge transmission |
| outputs: | | |
| 221 | Loadcount | Set Bit Counter to number of bits to be transmitted |
| 222 | Deccount | Decrease bit counter by one |
| 223 | Oneout | Set output pin to one |
| 224 | Dataout | Set output pin to least significant bit of shift register |
| 225 | Shiftout | Shift data register one place |
| 205 | Datagone | Transmission of data complete |
| 260 | Ackgone | Transmission of acknowledge complete |
| (FIG. 16) INPUT CONTROL STATE MACHINE 283 | | |
| inputs: | | |
| 200 | Mbusy | Memory bus busy |
| 201 | Reset | Transputer reset |
| 262 | Dataready | Data received from pin |
| 242 | Pregready | Process Register = READY |
| 243 | Pregnil | Process Register = NIL |
| 244 | Pregwptr | Process Register holds a workspace pointer |
| 260 | Ackgone | Transmission of acknowledge complete |
| outputs: | | |
| 220 | Setrequest | Set cpu request |
| 222 | SetPregready | Set Process Register to READY |
| 222 | SetPregnil | Set Process Register to NIL |
| 261 | Ackgo | Initiate acknowledge transmission |
| 263 | Datataken | Confirm receipt of data |
| INPUT DATA STATE MACHINE 282 | | |
| inputs: | | |
| 201 | Reset | Transputer reset |
| 230 | Datain | Data from pin |
| 231 | Countzero | Test if bit count zero |
| outputs: | | |
| 240 | Loadcount | Set Bit Counter to number of bits to be received |
| 241 | Deccount | Decrease bit counter by one |
| 244 | Shiftin | Shift data register one place taking least significant bit from pin |
| 245 | Setdataready | Reception of data complete |
| 246 | Setackready | Reception of acknowledge complete |

The sequences of each state machine are set out below with reference to present state, next state, input and output of each machine.

In any state, the outputs listed under the "outputs" column are one, and all other outputs are zero. All inputs are ignored except those mentioned in the "inputs" column. The symbols ∧, ∨ and Δ are used to denote the boolean operations and, or and not respectively.

| State | Inputs | Outputs | Next state |
|---|---|---|---|
| OUTPUT CONTROL STATE MACHINE 285 | | | |
| any | Reset | SetPregnil | sync1 |
| sync1 | Mbusy | | sync1 |
| sync1 | (ΔMbusy) ∧ Pregnil | SetPregready | syncreq1 |
| sync1 | (ΔMbusy) ∧ Pregwptr | Setrequest | syncreq1 |
| syncreq1 | ΔPregnil | | syncreq1 |
| syncreq1 | Pregnil | | send1 |
| send1 | ΔDatagone | Datago | send1 |
| send1 | Datagone | | send2 |
| send2 | Datagone | | send2 |
| send2 | ΔDatagone | | waitack1 |
| waitack1 | ΔAckready | | waitack1 |
| waitack1 | Ackready | | waitack2 |
| waitack2 | Ackready | Acktaken | waitack2 |
| waitack2 | ΔAckready | | sync2 |
| sync2 | Mbusy | | sync2 |
| sync2 | (ΔMbusy) ∧ Pregnil | SetPregready | syncreq2 |
| sync2 | (ΔMbusy) ∧ Pregwptr | Setrequest | syncreq2 |
| syncreq2 | ΔPregnil | | syncreq2 |
| syncreq2 | Pregnil | | sync1 |
| OUTPUT DATA STATE MACHINE 284 | | | |
| any | Reset | | idle |
| idle | (ΔDatago) ∧ (ΔAckgo) | | idle |
| idle | Ackgo | Oneout | Aakflag |
| idle | (ΔAckgo) ∧ Datago | Oneout | dataflag |
| ackflag | | | ackend |
| dataflag | | Oneout | databits |
| | | Loadcount | |
| databits | ΔCountzero | DecCount | databits |
| | | Shiftout | |
| | | Dataout | |
| databits | Countzero | | dataend |
| dataend | Datago | Datagone | dataend |
| dataend | ΔDatago | | idle |
| ackend | Ackgo | Ackgone | ackend |
| ackend | ΔAckgo | | idle |
| INPUT CONTROL STATE MACHINE 283 | | | |
| any | Reset | SetPregnil | receive1 |
| receive1 | ΔDataready | | receive1 |
| receive1 | Dataready | | sync1 |
| sync1 | Mbusy | | sync1 |
| sync1 | (ΔMbusy) ∧ Pregnil | SetPregready | syncreq1 |
| sync1 | (ΔMbusy) ∧ Pregwptr | Setrequest | syncreq1 |
| syncreq1 | ΔPregnil | | syncreq1 |
| syncreq1 | Pregnil | | sync2 |
| sync2 | Mbusy | | sync2 |
| sync2 | (ΔMbusy) ∧ Pregnil | SetPregready | syncreq2 |
| sync2 | (ΔMbusy) ∧ Pregwptr | Setrequest | syncreq2 |
| syncreq2 | ΔPregnil | | syncreq2 |
| syncreq2 | Pregnil | | receive2 |
| receive2 | Dataready | Datataken | receive2 |
| receive2 | ΔDataready | | acksend1 |
| acksend1 | ΔAckgone | Ackgo | acksend1 |
| acksend1 | Ackgone | | acksend2 |
| acksend2 | Ackgone | | acksend2 |
| acksend2 | ΔAckgone | | receive1 |
| INPUT DATA STATE MACHINE 282 | | | |
| any | Reset | | idle |
| idle | ΔDatain | | idle |
| idle | Datain | | start |
| start | ΔDatain | SetAckready | idle |
| start | Datain | LoadCount | databits |
| databits | ΔCountzero | Shiftin | databits |
| | | DecCount | |
| databits | Countzero | Shiftin | dataend |
| dataend | — | SetDataready | idle |

As shown in FIG. 16, the input control logic includes a flip-flop 280 connected to the output 246 of the input data state machine 282. A further flip-flop 281 is connected to the output 245 of the input data state machine 282. Both control state machines are controlled by clock pulses derived from the clock 28. For some of the links, both data state machines are also controlled by clock pulses derived from the clock 28. For the link shown in FIGS. 15 and 16, the data state machines are controlled by clock pulses derived from a different clock 22 related in phase to clock 28, which allows this link to operate at a lower speed. Two different clock frequencies can be obtained in order to achieve maximum efficiency depending on the type of microcomputer network which is operated. When microcomputers are grouped closely together communications between them can be carried out more quickly in which case a higher clock frequency can be used. A lower clock frequency can be used to enable satisfactory communication where the microcomputers are more remote and require a lower operating speed.

In both the input and output channels the control state machine monitors the content of the process register 47 and when appropriate generates a CPU request on line 199 by setting the latch 197.

The output control state machine 285 first synchronises with a process using the output process register 47. It then uses the "datago" signal 211 to cause the output data state machine 282 to output the data in the output data register 48 through the pin 27. The output data state machine 284 sends the data in the manner described with reference to FIG. 13a and shifts the data in the register 48 until a count in the counter 286 expires. When it has done this it returns the "datagone" signal 205 to the output control state machine to indicate that the transfer of data is complete and that the "datago" signal should be removed. The output control state machine then waits for the "ackready" signal 264 from the latch 280, signifying that the input data state machine 282 has received an acknowledge packet as described in FIG. 13b from the pin 26. In response to the "ackready" signal 264, the output control state machine outputs an "acktaken" signal 265, which resets the latch 280. The output control logic then uses the output process register 47 to synchronise again with the outputting process.

The input data state machine 282 and the microcomputer at the other end of the link is waiting for "start bit" to appear on the input pin 26. When a data packet is detected, the input data state machine 282 of that microcomputer shifts data into the data shift register 48 until the counter 287 indicates that the appropriate number of bits have been received, and then sets the "data received" latch 281. The input control state machine 283 detects the "dataready" signal 262 and responds by resetting the "data received" latch 281. It then synchronises with an inputting process using the input process register 47. It then synchronises again with the inputting process using the process register 47 to confirm that the process has taken the data from the data register 48, and then uses the "ackgo" signal 261 to cause the output data state machine to transmit an acknowledge packet via the pin 27. When the output data state machine 284 is not transmitting data it generates the start and stop bits which constitute the acknowledge packet described in FIG. 13b. The input data state machine 282 of the microcomputer which transmitted the data packet detects the acknowledge packet and sets the "acknowledge received" latch 280. As described above, the output control state machine 285 of the transmitting microcomputer has been waiting for this and on detecting the signal resets the latch 280 and performs a second synchronise operation. The state of the link logic in both the output and input links is now the same as it was before the communication took place so that it is ready for the next transmission.

CHIP AND MEMORY FORMATION

As mentioned above, the microcomputer of this example is particularly advantageous in having sufficient memory in the form of RAM on the chip (integrated circuit device) to enable the microcomputer to operate without the necessity for external memory, although external memory can be used when required. There are a number of problems in providing sufficient space for adequate memory on the same chip as the processor. It is necessary to minimise the area required for each memory cell as well as reducing noise interference in the RAM from asynchronously operating circuitry such as a processor on the same chip, while at the same time providing a satisfactory manufacturing yield of acceptable microcomputers from a number of silicon chips, particularly as the memory may be the largest and densest component created on the chip.

In order to minimise the chip area required for each memory cell, this example uses static RAM cells (SRAM) using high impedance resistive loads rather than the more conventional depletion transistor loads or complementary pull-up transistors. The manufacturing technology used in this example employs a film of high resistivity polycrystalline silicon in which the resistive loads are formed. The memory may have 32K bits of SRAM where each cell consists of transistors having gates formed in a film of polycrystalline silicon. The transistor gates and resistive loads may be formed in the same, or different films of polycrystalline silicon.

Resistor load SRAMs are susceptible to interference from electrical noise injected into the silicon material in which they are formed and stored data can be corrupted by any minority carriers which may be present. In order to shield the SRAM from noise generated by other on chip circuitry and from minority carriers injected by other on chip circuitry the SRAM is formed in an electrically isolated area of silicon as shown in FIG. 17. An n-channel substrate 300 is formed with separate p-wells 301, and 302. The array of RAM cells are isolated from other circuitry and associated substrate noise by locating the RAM array in the p-well marked 301. This isolates the RAM cells from minority carriers generated in the substrate by the well-to-substrate potential barrier and any minority carriers generated within the well have a high probability of being collected in the substrate. In FIG. 17, the RAM array will be an n-channel array located in the p-well 301. Any n-channel transistors of peripheral circuitry are isolated from the RAM array by placing them in a further p-well 302.

This technique is fully compatible with either NMOS or P-well CMOS manufacturing technology. In the current example P-well CMOS is used any any p-channel transistors of peripheral circuitry are placed on the n-substrate and isolated from the RAM array by the well-to-substrate potential barrier. Each well containing a memory array is surrounded by a metal ground which contacts the memory array well around its periphery via a heavily doped p diffusion. Within the memory array there is a p diffusion contacting the well to ground for each pair of cells. Substrate bias is unnecessary.

In order to provide acceptable manufacturing yield of products from silicon chips, memory redundancy is incorporated. The memory is divided into rows and columns accessible respectively by row and column decoders. In addition to the normal rows and normal columns the redundancy provides some additional rows and columns together with spare row and column decoders in order to obtain access to the spare rows and columns. The spare column decoders and spare row decoders each incorporate fuses which for example can be open circuited by use of a laser so that when any defective rows or columns are determined during test, fuses can be open circuited by laser techniques to disable the row or column detector of any normal rows or columns which have been found to be defective and the replacement row or column from the redundant rows and columns can be brought into an enabled position by programming the appropriate spare row decoder or spare column decoder with the address of the defective row or column.

In order to allow N-well CMOS manufacturing technology to be used the following alternative isolation technique may be employed. Referring to FIG. 18 a low resistivity P type substrate (405) is used on which a high resistivity P type epitaxial layer is formed.

The cell array is formed in this epitaxial layer in region (401) and is entirely surrounded by a deep N-well diffusion (402). Minority carriers generated by other circuitry in region (403) will be attracted to the N-wells (402) where they become harmless majority carriers, or will recombine in the heavily doped P-type substrate (405). P-channel transistors are placed in N-wells (404) where they are isolated by the well to substrate potential barrier.

ADDITIONAL MATERIAL

The invention is not limited to the details of the foregoing example. For instance, although the serial links shown in FIG. 2 have separate process registers 47, the function provided by the registers 47 may be effected by memory locations in the RAM 19. In this case the CPU must be able to identify the serial link which it is serving and this may be achieved by connecting each channel of each serial link separately to the sync logic 10 in FIG. 2.

One set of data registers and buses is shown in FIG. 3 and in some cases it may be desirable to include two such sets in one microcomputer, or even to have two CPUs in one microcomputer.

The principle described above of using pfix and nfix functions to vary the length of operand is applicable to a microcomputer of any word length.

The invention is not limited to a machine operating with 16 bit words nor to 16 bit operand registers, e.g. processors having a word length of 8 bits or multiples of 8 bits may use these instructions. The invention is particularly applicable to 32 bit word microcomputers.

The CPU may include further registers, in an evaluation stack, such as a CREG or even DREG in addition to the A and B registers. Some functions and operations may then be modified to allow the additional registers. For example:

Areg := Breg may be replaced by
SEQ
    Areg := Breg
    Breg := Creg

Creg := Dreg

Breg := Areg may be replaced by
SEQ
   Dreg := Creg
   Creg := Breg
   Breg := Areg Other functions or operations may of course be added to exploit the extra registers. Although the illustrated embodiment described herein and shown in FIG. 3 includes only an A register and a B register, in a preferred embodiment of the present invention, three registers are used in a stack.

It will be appreciated that in the above description, the function set lists a plurality of functions followed by an extendable list of operations which may be selected by use of the indirect function "operate". In all cases these functions and operations can be considered as forms of instruction usable in the program to operate the microcomputer. However in order to obtain the advantages discussed above for a fixed format of "instruction" as shown in FIG. 5, the list of functions and operations can be considered as a set of primary instructions (consisting of the direct functions, prefixing functions and indirect functions) and a set of secondary instructions (consisting of the operations which may be selected by use of the indirect function). To maximise efficiency, the primary instructions which are most commonly used require only 4 bits of the instruction format shown in FIG. 5 and so the other 4 bits can be used for data to be loaded into the operand register 65 and used as an operand for the instructions. For the secondary instructions which are less commonly used, all 8 bits of the instruction format shown in FIG. 5 are needed to identify the instruction required. Consequently the fixed format of the instruction shown in FIG. 5 allows no data to accompany a secondary instruction and secondary instructions therefore operate on data held in registers other than the operand register 65.

Although the instruction format shown in FIG. 4 comprises 8 bits divided into two halves, it will be understood that other bit lengths may be used and the division into function and data need not necessarily provide equal bit lengths for the two parts.

It is to be appreciated that the present arrangement described herein provides a combination which dramatically improves the efficiency and throughput of the microcomputer. By using instructions having a constant format, by having a function set where the most often used functions are directly available whereas other used functions are indirectly available, by arranging for communication between processes and synchronisation among them, by permitting point-to-point communication between microcomputers, and by providing memory on the same chip as each microprocessor, a microcomputer according to various aspects of the invention can achieve a speed of 10 million instructions per second. An array housed on a board of only 10 inches by 20 inches should be able to achieve a speed of 1000 million instructions per second. A Transputer (trade mark) microcomputer array using OCCAM (trade mark) should be able to achieve speeds approximately two orders of magnitude faster, than, for example, a Motorola 68000 using PASCAL. A single Transputer programmed in OCCAM should be about two or three times faster than a single 68000 microprocessor using PASCAL. In the prior art, when microcomputers are added in an array, the incremental gain in performance is progressively less and less with an increase in processors. However, by using the microcomputer of this example, the increase in performance is a linear function of the number of processors. Thus it will be appreciated that the present combination achieves dramatically increased performance over the state of the art.

I claim:

1. A method of operating a process in a microcomputer having a processor, a memory having addressable memory locations and a program defining instructions to be executed, the method using a set of instructions having the same bit length and the same format so as to improve speed of operation and improve efficient use of memory, said method comprising:
    (a) establishing within the memory a workspace for the process, the workspace comprising a plurality of said addressable memory locations,
    (b) recording in locations of the workspace variables associated with the process,
    (c) establishing a first pointer pointing to a location of the said workspace,
    (d) maintaining a first register containing said first pointer and employing one or more second registers for storing variables or other information related to the process,
    (e) obtaining instructions from said memory in accordance with the program, each of said instructions having a data portion and a function portion, said function portion having bits which indicate a selected function from a set of selectable functions, said function set including a first type function and a second type function, all of said instructions having the same bit length and same format of bit positions, each of said data portions having a bit length less than the number of bits which would be required to address directly each of said addressable memory locations,
    (f) in response to an instruction designating said first type function, combining the contents of said first register with said data portion of said instruction to define a memory address associated with said workspace for the process and performing a transfer of information using said memory address, and
    (g) in response to an instruction designating said second type function, combining the contents of a said second register with said data portion of said instruction to define an addressable memory location and performing a transfer of information using said addressable memory location.

2. The method of claim 1 which further comprises operating a plurality of concurrent processes and defining a plurality of workspaces, each corresponding to a process to be executed and each having a respective first pointer, and holding in said first register the first pointer for the process which is currently executed by the processor.

3. The method of claim 1 further comprising:
    receiving a sequence of instructions from said memory, said sequence including an instruction designating said second type function after an instruction designating said first type function,
    in response to said instruction indicating said first type function, performing said transfer of information corresponding to said instruction designating said first type function by loading into said second register a value derived from said memory address;

in response to said instruction indicating said second type function, performing said transfer of information corresponding to said instruction designating said second type function by reloading said second register with data derived from said addressable memory location.

4. The method of claim 1 wherein the set of selectable functions further includes a concatenation function, said method including responding to an instruction designating said concatenation function by arranging the data portion thereof for concatenation with a data portion of another instruction.

5. The method of claim 1 wherein said set of selectable functions further includes an indirect function, said method including responding to an instruction designating said indirect function by decoding the function portion thereof to indicate that the data portion of said instruction is not an operand and employing the data portion thereof to determine an operation to be carried out by the microcomputer on data other than that provided by said data portion of said instruction.

6. The method of claim 1 wherein each instruction comprises one byte consisting of eight bits, and wherein data transfers to and from the registers comprise integral multiples of eight bit bytes.

7. The method of claim 1 including:
maintaining a network of interconnected microcomputers each operating on a respective process,
outputting a message through a communication channel of one microcomputer,
inputting said message through a communication channel of a further microcomputer interconnected to said one microcomputer, and
synchronizing said outputting and inputting by suspending execution of the process on said one microcomputer when it reaches a program stage requiring message transmission involving said further microcomputer until said further microcomputer has reached a corresponding program stage.

8. The method of claim 7 wherein the first of a communicating pair of said microcomputers to reach a program stage requiring communication between them suspends execution of its process and provides an indication in a communication channel of the other microcomputer identifying the process which has been suspended and is awaiting communication.

9. The method of claim 1 including maintaining a data stack including a said second register, said method including responding to selected instructions to transfer data onto or from said stack.

10. The method of claim 1 including maintaining an operand register for temporarily storing variables or other information related to the process;
said function set further including an instruction offset function, said method further including establishing an instruction pointer value indicating the stage of execution of said program, responding to an instruction designating said instruction offset function by causing a change in the program stage for the process, decoding said non-function portion of the instruction and loading an offset value into said operand register, and decoding said function portion causing the formation of a new instruction pointer incorporating said offset value.

11. The method of claim 10 including maintaining an instruction pointer register containing a pointer to the next instruction to be executed and in response to said instruction designating said instruction offset function, combining the contents of said operand register and said instruction pointer register to define said new instruction pointer.

12. A method according to claim 2 for operating concurrent processes in a computing system in response to a plurality of instructions of the same bit size and same bit format, the method comprising the steps of:
defining a memory region as a workspace for a first process, said workspace being a group of addressable memory locations;
executing said first process using said workspace and a processor;
defining a channel for communication between said first process and a second process, said channel having an address, said channel being addressable by only two processes at a time;
storing a value in said channel when said first process is ready to provide data for said second process;
defining a memory region as a second workspace for a second process;
executing said second process, including addressing said channel, and if said value has been stored in said channel, then reading said data.

13. The method of claim 12 wherein said channel has a first portion for process identification data and a second portion for storing data temporarily, said method including storing data in said second portion and storing identification data in said first portion of the process which is storing the data in the second portion.

14. A microcomputer comprising an integrated circuit device including:
a processor for executing a process,
a memory having addressable memory locations and providing storage for a program to be executed, said memory further providing a workspace for recording variables associated with said process,
a plurality of addressable locations addressable by said processor, including said addressable memory locations,
a plurality of registers including an operand register and a workspace pointer register for holding a pointer to an addressable location of said workspace,
controllable bus means coupled to said registers,
means for receiving an instruction from said program, said instruction being selected from a set in which each instruction has the same bit length and the same format, each instruction having a function portion and a data portion, said function portion including bits which indicate a selected function from a set of selectable functions, said function set including a first type function and a second type function, said data portion having a bit length less than the number of bits which would be required to address directly each of said addressable memory locations, said means for receiving being coupled to load said data portion of each instruction into said operand register, and
control means coupled to receive said function portion of said instruction and coupled to control said bus means so that the function of the microcomputer depends on said bits of said function portion, said control means being responsive to said function portion bits indicating said first type function to use the contents of said operand register and said workspace pointer register to develop an address of an addressable location and to cause an information transfer between one of said registers and said addressable location, said control means being responsive to said function portion bits indicating said second type function to combine the contents of said operand register with the contents of another one of said registers to develop a further address of an addressable location and to cause an information transfer between said another register and the addressable location at said further address.

15. The microcomputer according to claim 14 wherein said integrated circuit further includes an instruction pointer register for holding an instruction pointer indicating a program stage, and wherein said function set further includes an instruction pointer function, said control means being responsive to an instruction indicating said instruction pointer function to use the contents of said operand register and the contents of said instruction pointer register to develop a new instruction pointer, said control means being responsive to said new instruction pointer to select a subsequent instruction from said program.

16. The microcomputer according to claim 14 wherein said function set further includes an indirect function and wherein said control means is responsive to an instruction indicating said indirect function to decode its function portion to indicate that the data portion of said instruction is not an operand and to employ said data portion to determine an operation to be carried out by the microcomputer on data other than that provided by said data portion of said instruction.

17. The microcomputer according to claim 14 wherein said integrated circuit further includes an instruction pointer register for holding an instruction pointer indicating a program stage, wherein said function set further includes an instruction type function, and wherein said control means is responsive to an instruction indicating said instruction type function to use the contents of said operand register and contents of said instruction pointer register to develop a new pointer and to transfer said new pointer into a further register.

18. The microcomputer according to claim 17 wherein said control means is responsive to said instruction indicating said instruction type function to store the contents of said instruction pointer register at an addressable location, to enter further information into said instruction pointer register, and to enter further information into said workpiece pointer register.

19. The microcomputer according to claim 18 wherein said further information entered into said workspace pointer register is based on combining the contents thereof with the contents from said operand register.

20. The microcomputer according to claim 19 in which said control means comprises a micro-instruction program providing a plurality of selectable output signals in the form of micro-instructions, and address means responsive to said function portion of each instruction for providing an address signal to said microinstruction program to select one or more microinstructions in accordance with said address.

21. The microcomputer according to claim 19 wherein said function set includes a plurality of direct functions, said control means being responsive to an instruction designating a direct function to cause said processor to carry out an operation on the contents of said operand register, said direct functions including said first type and second type functions.

22. The microcomputer according to claim 21 wherein said function set further includes an indirect function, said control means being responsive to an instruction designating said indirect function to cause said processor to carry out an operation determined by data in said operand register on data held in one or more of the other said registers.

23. The microcomputer according to claim 19 wherein a group of said plurality of registers is coupled in a stack, said another one of said registers forming the topmost element of the stack, so that when data is written into or read from said one of said registers, data is moved up or down in the other registers in said stack.

24. The microcomputer according to claim 19 in which said function set includes a direct function, said control means being responsive to an instruction designating said direct function to load a literal value from said operand register into a selected other one of said registers.

25. The microcomputer according to claim 19 wherein said means for receiving an instruction from said program has four bit positions for receiving said function portion of each instruction, whereby the four bits permit a maximum of 16 binary coded functions.

26. The microcomputer according to claim 19 wherein said function set further includes a concatenation function; wherein said operand register has a bit length greater than the bit length of the data portion of a single instruction; and wherein said control means is responsive to an instruction designating said concatenation function to position the data portion of said instruction in the operand register for concatenation with the data portion of a further instruction.

27. The microcomputer according to claim 26 wherein four bit positions are allocated for said function bits of each instruction and four bit positions are allocated for said data bits for each instruction.

28. The microcomputer according to claim 19 in which each instruction is 1 byte long and the registers hold integral multiples of bytes.

29. The microcomputer according to claim 19 further including communication channels addressable by said processor to permit input or output of messages by a process executed by the microcomputer.

30. The microcomputer as claimed in claim 29 wherein said function set further includes a synchronization function for synchronization of messages through a said communication channel, said control means being responsive to an instruction designating said synchronization function to locate in a store associated with said channel one or more values repesenting the state of the channel, said control means being responsive to said one or more values for use in message synchronization based thereon.

31. The microcomputer according to claim 19 for operating a plurality of concurrent processes, said memory comprising RAM providing, for each process, a respective workspace for recording variables associated with a corresponding process.

32. The microcomputer according to claim 19 in which the processor and memory are provided on a single integrated circuit chip.

* * * * *